United States Patent
Watanabe et al.

(10) Patent No.: US 11,450,390 B2
(45) Date of Patent: Sep. 20, 2022

(54) SEMICONDUCTOR INTEGRATED CIRCUIT AND SEMICONDUCTOR STORAGE DEVICE

(71) Applicant: Kioxia Corporation, Tokyo (JP)

(72) Inventors: Fumiya Watanabe, Chigasaki (JP); Masaru Koyanagi, Ota (JP); Yutaka Shimizu, Yokohama (JP); Yasuhiro Hirashima, Kawasaki (JP); Kei Shiraishi, Kawasaki (JP); Mikihiko Ito, Ota (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/118,703

(22) Filed: Dec. 11, 2020

(65) Prior Publication Data

US 2021/0295930 A1    Sep. 23, 2021

(30) Foreign Application Priority Data

Mar. 18, 2020 (JP) .............................. JP2020-047154

(51) Int. Cl.
| | |
|---|---|
| *G11C 11/08* | (2006.01) |
| *G11C 16/32* | (2006.01) |
| *G11C 7/10* | (2006.01) |
| *G11C 16/10* | (2006.01) |

(52) U.S. Cl.
CPC ............ *G11C 16/32* (2013.01); *G11C 7/1087* (2013.01); *G11C 7/1093* (2013.01); *G11C 16/10* (2013.01)

(58) Field of Classification Search
CPC ..... G11C 16/32; G11C 7/1087; G11C 7/1093; G11C 16/10
See application file for complete search history.

(56) References Cited

U.S. PATENT DOCUMENTS

| | | | | |
|---|---|---|---|---|
| 7,459,943 | B2 * | 12/2008 | Yen ...................... | G11C 27/024 327/91 |
| 11,211,130 | B2 * | 12/2021 | Hirashima ............. | G11C 7/109 |
| 2008/0265993 | A1 * | 10/2008 | Rallabandi ............ | H03F 3/3022 330/255 |
| 2013/0043921 | A1 * | 2/2013 | Dixit ................ | H03K 3/356156 327/202 |
| 2019/0295661 | A1 | 9/2019 | Hirashima et al. | |
| 2020/0265902 | A1 | 8/2020 | Hirashima et al. | |

FOREIGN PATENT DOCUMENTS

JP          2019-169208 A     10/2019

* cited by examiner

*Primary Examiner* — Pho M Luu
(74) *Attorney, Agent, or Firm* — Oblon, McClelland, Maier & Neustadt, L.L.P.

(57) ABSTRACT

In a semiconductor integrated circuit, an input circuit includes an input and an output stage electrically connected to the input stage via a first node and a second node. The input stage includes a first transistor, a second transistor, a third transistor, a fourth transistor, a first time constant adjusting circuit, and a second time constant adjusting circuit. The first transistor includes a gate that receives an input signal. The second transistor includes a gate that receives a reference signal. The third transistor is disposed adjacent to a drain of the first transistor. The fourth transistor is disposed adjacent to a drain of the second transistor. The first time constant adjusting circuit is electrically connected between a gate of the third transistor and the first node. The second time constant adjusting circuit is electrically connected between a gate of the fourth transistor and the second node.

19 Claims, 14 Drawing Sheets

DATA SIGNAL DQ

POTENTIAL OF
INTERMEDIATE
NODE $N_{M1}$

GATE POTENTIAL OF
TRANSISTOR Tr3

DATA SIGNAL DQ

POTENTIAL OF
INTERMEDIATE
NODE $N_{M2}$

GATE POTENTIAL OF
TRANSISTOR Tr4

SEMICONDUCTOR INTEGRATED CIRCUIT AND SEMICONDUCTOR STORAGE DEVICE

CROSS-REFERENCE TO RELATED APPLICATIONS

This application is based upon and claims the benefit of priority from Japanese Patent Application No. 2020-057154, filed on Mar. 18, 2020; the entire contents of which are incorporated herein by reference.

FIELD

Embodiments described herein relate generally to a semiconductor integrated circuit and a semiconductor storage device.

BACKGROUND

A semiconductor integrated circuit including an input circuit may clock synchronously latch a data signal received via the input circuit and used in the semiconductor integrated circuit. The input circuit is preferred to have appropriate operating speed in this case.

DETAILED DESCRIPTION

In general, according to one embodiment, there is provided a semiconductor integrated circuit including an input circuit. The input circuit has an input stage, and an output stage electrically connected to the input stage via a first node and a second node. The input stage includes a first transistor, a second transistor, a third transistor, a fourth transistor, a first time constant adjusting circuit and a second time constant adjusting circuit. The first transistor has a gate that receives an input signal. The second transistor has a gate that receives a reference signal. The third transistor is disposed adjacent to a drain of the first transistor. The fourth transistor is disposed adjacent to a drain of the second transistor. The first time constant adjusting circuit is electrically connected between a gate of the third transistor and the first node. The second time constant adjusting circuit is electrically connected between a gate of the fourth transistor and the second node.

Exemplary embodiments of a semiconductor integrated circuit will be explained below in detail with reference to the accompanying drawings. The present invention is not limited to the following embodiments.

Embodiment

Figure 1:
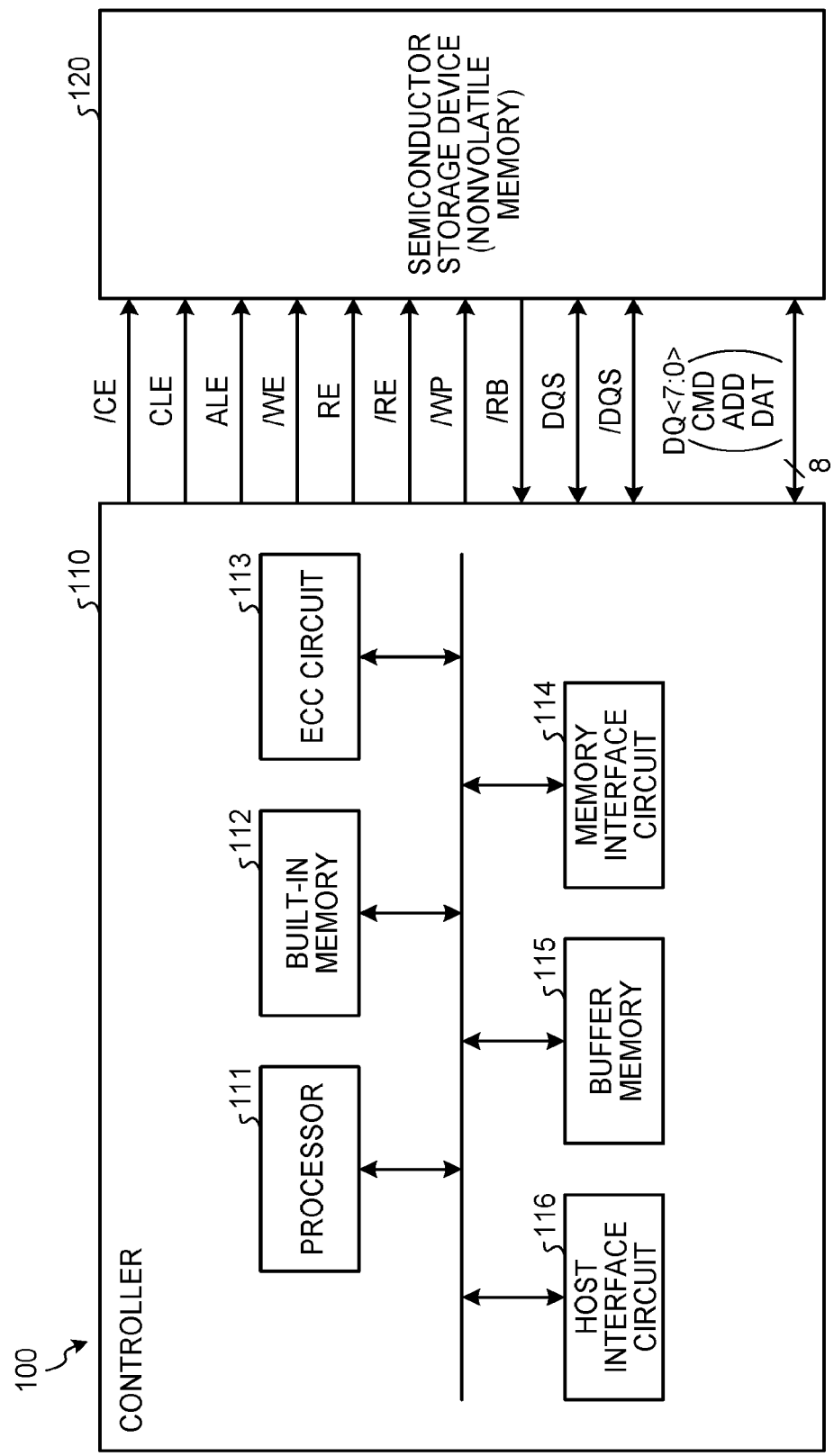
FIG. 1 is a diagram illustrating a configuration of a memory system including a semiconductor storage device provided with a semiconductor integrated circuit according to an embodiment.

The semiconductor integrated circuit according to the embodiment includes the input circuit. The semiconductor integrated circuit may clock synchronously latch a data signal received via the input circuit and used for predetermined operation. For example, the semiconductor integrated circuit may be applied as a peripheral circuit in a semiconductor storage device 120 having a memory cell array. The semiconductor storage device 120 is applicable to a memory system 100 exemplarily illustrated in FIG. 1. FIG. 1 is a diagram illustrating a configuration of the memory system 100 including the semiconductor storage device 120 provided with the semiconductor integrated circuit.

For example, the memory system 100 may be communicably connected to an external host (not illustrated), to function as an external storage device for the host.

As illustrated in FIG. 1, the memory system 100 includes a controller 110 and the semiconductor storage device 120. The controller 110 receives a command from the host and controls the semiconductor storage device 120 in accordance with the command thus received. The controller 110 writes, to the semiconductor storage device 120, data instructed to write by the host, reads, from the semiconductor storage device 120, data instructed to read by the host, and transmits the data thus read to the host. The controller 110 is connected to the semiconductor storage device 120 via a memory bus. The semiconductor storage device 120 is a nonvolatile memory having a memory cell array provided with a plurality of arrayed memory cells and storing data or the like in a nonvolatile manner.

The memory bus transmits and receives, via a separate signal line, each of signals /CE, CLE, ALE, /WE, RE, /RE, /WP, /RB, DQS, /DQS, and DQ<7:0> according to a memory interface. The signal /CE is used to enable the semiconductor storage device 120. The signal CLE is used to notify the semiconductor storage device 120 that the signals DQ<7:0> flowing to the semiconductor storage device 120 while the signal CLE has an "H (High)" level correspond to commands. The signal ALE is used to notify the semiconductor storage device 120 that the signals DQ<7:0> flowing to the semiconductor storage device 120 while the signal ALE has an "H" level correspond to addresses. The signal /WE is used to command the semiconductor storage device 120 to import the signals DQ<7:0> flowing to the semiconductor storage device 120 while the signal /WE has an "L (Low)" level. The signals RE and /RE are complementary signals each used to command the semiconductor storage device 120 to output the signals DQ<7:0>. The signal /WP is used to command the semiconductor storage device 120 not to write or erase data. The signal /RB indicates whether the semiconductor storage device 120 is in a ready state (of being capable of receiving any external command) or is in a busy state (of being incapable of receiving any external command). The signals DQS and /DQS are complementary signals each used as a strobe signal for control of operation timing of the semiconductor storage device 120 according to the signals DQ<7:0>. The signals DQ<7:0> are data signals of eight bits or the like. Each of the data signals DQ<7:0> is substantial data transmitted and received between the semiconductor storage device 120 and the controller 110, and includes a command CMD, an address ADD, and data DAT. The data DAT includes written data and read data.

The controller 110 includes a processor (central processing unit (CPU)) 111, a built-in memory (random access memory (RAM)) 112, an error check and correction (ECC) circuit 113, a memory interface circuit 114, a buffer memory 115, and a host interface circuit 116.

The processor 111 controls operation of the entire controller 110. The processor 111 issues, to the semiconductor storage device 120, a read command according to the memory interface in response to a data read command received from the host or the like. The processor 111 operates similarly for writing and erasure. The processor 111 also has a function of executing various calculations to read data from the semiconductor storage device 120.

The built-in memory 112 is, for example, a semiconductor memory such as a dynamic RAM (DRAM), and is used as a work area of the processor 111. The built-in memory 112 stores firmware for management of the semiconductor storage device 120, various types of management tables, and the like.

The ECC circuit 113 detects and corrects errors. Upon writing data, the ECC circuit 113 generates an ECC code for each set of a certain number of pieces of data in accordance with data received from the host. Upon reading data, the ECC circuit 113 executes ECC decoding in accordance with the ECC code and detects whether or not there is any error. If there is found any error, the ECC circuit 113 specifies a bit position of the error and corrects the error.

The memory interface circuit 114 is connected to the semiconductor storage device 120 via the memory bus, and controls communication with the semiconductor storage device 120. The memory interface circuit 114 transmits, to the semiconductor storage device 120, the command CMD, the address ADD, and written data in response to a command from the processor 111. The memory interface circuit 114 also receives read data from the semiconductor storage device 120.

The buffer memory 115 temporarily stores data and the like received by the controller 110 from the semiconductor storage device 120 and the host. The buffer memory 115 is also used as a storage area for temporarily storing read data from the semiconductor storage device 120, a calculation result for the read data, and the like.

The host interface circuit 116 is connected to the host and controls communication with the host. The host interface circuit 116 transfers a command and data received from the host or the like to the processor 111 and the buffer memory 115.

Figure 2:
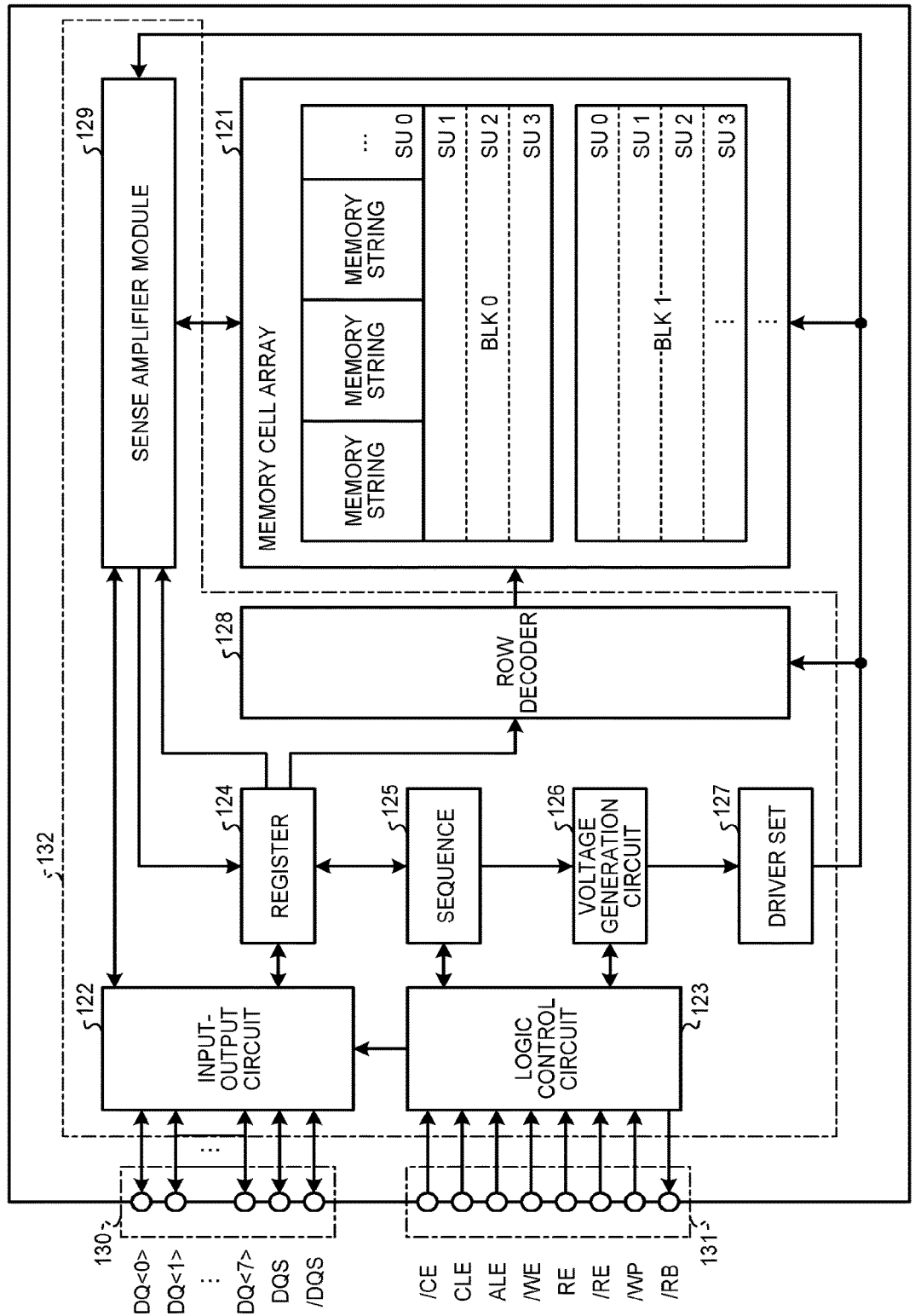
FIG. 2 is a diagram illustrating a configuration of the semiconductor storage device including the semiconductor integrated circuit according the embodiment.

The semiconductor storage device 120 may be configured as illustrated in FIG. 2. FIG. 2 illustrates the configuration of the semiconductor storage device 120.

The semiconductor storage device 120 includes a memory cell array 121, a semiconductor integrated circuit 132, an input-output pin group 130, and a logic control pin group 131. The semiconductor integrated circuit 132 is disposed around the memory cell array 121. The semiconductor integrated circuit 132 is electrically connected between the memory cell array 121 and the input-output pin group 130, the logic control pin group 131.

The semiconductor integrated circuit 132 includes an input-output circuit 122, a logic control circuit 123, a register 124, a sequencer 125, a voltage generation circuit 126, a driver set 127, a row decoder 128, and a sense amplifier module 129.

The memory cell array 121 includes a plurality of nonvolatile memory cells (not illustrated) associated with a word line and a bit line. The plurality of nonvolatile memory cells is subjected to write processing and read processing by a unit called a page, and is subjected to erasure processing by units called physical blocks BLK (BLK0, BLK1, . . . ) including a plurality of pages. The physical blocks BLK each have a plurality of string units SU0 to SU3. The string units SU0 to SU3 each function as a drive unit in a corresponding one of the physical blocks BLK. The string units SU0 to SU3 each include a plurality of memory strings. Each memory string MST includes a plurality of memory cell transistors each functioning as a nonvolatile memory cell.

The input-output circuit 122 transmits and receives the data signals DQ<7:0> and the strobe signals DQS and /DQS to and from the controller 110. The input-output circuit 122 confirms a command and an address in each of the data signals DQ<7:0> in accordance with the strobe signals DQS and /DQS, and transfers the command and the address to the register 124. The input-output circuit 122 confirms written data and read data in accordance with the strobe signals DQS and /DQS, and transmits and receives the written data and the read data to and from the sense amplifier module 129.

The logic control circuit 123 receives the signals /CE, CLE, ALE, /WE, RE, /RE, and /WP from the controller 110. The logic control circuit 123 transfers the signal /RB to the controller 110 to externally notify of a state of the semiconductor storage device 120.

The register 124 stores the command and the address. The register 124 transfers the address to the row decoder 128 and the sense amplifier module 129, and transfers the command to the sequencer 125.

The sequencer 125 receives the command, and controls the entire semiconductor storage device 120 in accordance with a sequence according to the command thus received.

The voltage generation circuit 126 generates voltage necessary for operation such as writing, reading, and erasure data in accordance with a command from the sequencer 125. The voltage generation circuit 126 supplies the driver set 127 with the voltage thus generated.

The driver set 127 includes a plurality of drivers, and supplies the row decoder 128 and the sense amplifier module 129 with various voltages from the voltage generation circuit 126 in accordance with the address from the register 124. For example, the driver set 127 supplies the row decoder 128 with various voltages in accordance with a row address included in the address.

The row decoder 128 receives the row address in the address from the register 124, and selects a memory cell in a row according to the row address. The voltage from the driver set 127 is transferred to the memory cell in the row thus selected via the row decoder 128.

Upon reading data, the sense amplifier module 129 senses read data read from the memory cell to the bit line and transfers the read data thus sensed to the input-output circuit 122. Upon writing data, the sense amplifier module 129 transfers written data written via the bit line to the memory cell. The sense amplifier module 129 receives a column address included in the address from the register 124, and outputs data in a column according to the column address.

The input-output pin group 130 transfers, to the input-output circuit 122, the data signals DQ<7:0> and the strobe signals DQS and /DQS received from the controller 110. The input-output pin group 130 transfers, to outside the semiconductor storage device 120, the data signals DQ<7:0> transmitted from the input-output circuit 122.

The logic control pin group 131 transfers, to the logic control circuit 123, the signals /CE, CLE, ALE, /WE, RE, /RE, and /WP received from the controller 110. The logic control pin group 131 transfers, to outside the semiconductor storage device 120, the signal /RB transmitted from the logic control circuit 123.

Figure 3:
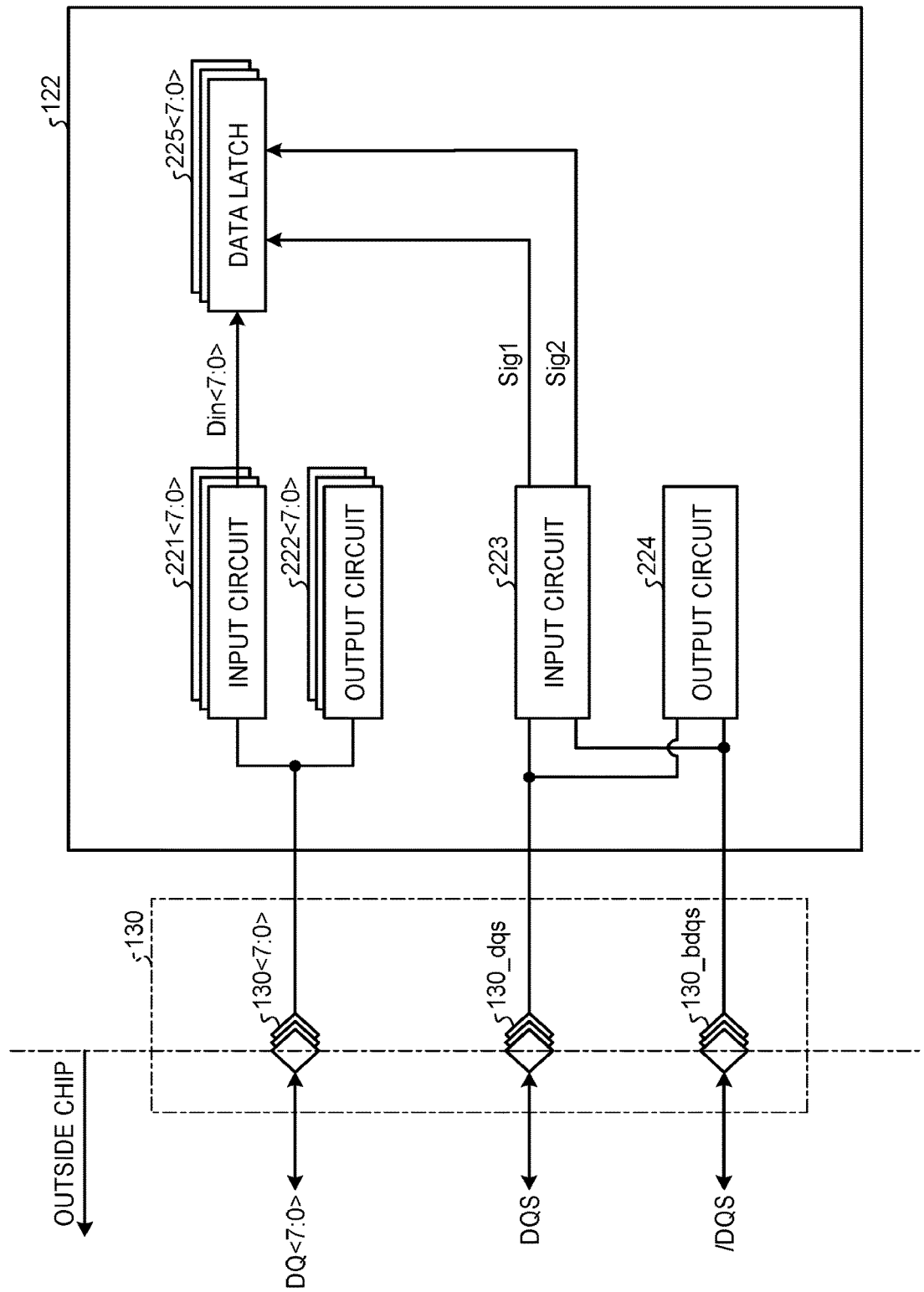
FIG. 3 is a diagram illustrating a configuration of an input-output circuit according the embodiment.

The input-output circuit 122 in the semiconductor storage device 120 may be configured as illustrated in FIG. 3. FIG. 3 is an explanatory block diagram of a functional configuration of the input-output circuit 122.

As illustrated in FIG. 3, the input-output circuit 122 includes input circuits 221<7:0>, output circuits 222<7:0>, an input circuit 223, an output circuit 224, and data latches 225<7:0>. An input circuit 221<k> corresponds to an input circuit for a data signal DQ<k>. The input circuit 223 corresponds to an input circuit for the strobe signals DQS and /DQS.

The data signal DQ<k> or the like is allocated to a single set of the input circuit 221<k> and an output circuit 222<k> (0≤k≤7). The set of the input circuit 221<k> and the output circuit 222<k> may transmit and receive the data signal DQ<k> to and from the external controller 110 via a pin 130<k> included in the input-output pin group 130. When receiving the data signal DQ (<k>, the input circuit 221<k> generates a data signal Din<k> and transmits the data signal Din<k> to a corresponding data latch 225<k>.

The set of the input circuit 223 and the output circuit 224 may transmit and receive the strobe signal DQS and /DQS to and from the external controller 110 via a pin 130 dqs included in the input-output pin group 130. When receiving the strobe signal DQS and /DQS, the input circuit 223 generates strobe signals Sig1 and Sig2 and transmits the strobe signals Sig1 and Sig2 to the data latches 225<7:0>.

When the data latches 225<7:0> receive data signals Din<7:0> from the corresponding input circuits 221<7:0> and receive the strobe signals Sig1 and Sig2 from the input circuit 223, the data latches 225<7:0> latch data included in the data signals DQ<7:0> in accordance with these signals.

Each of the input circuits 221 and 223 is also called an input buffer or an input receiver.

Figure 4:
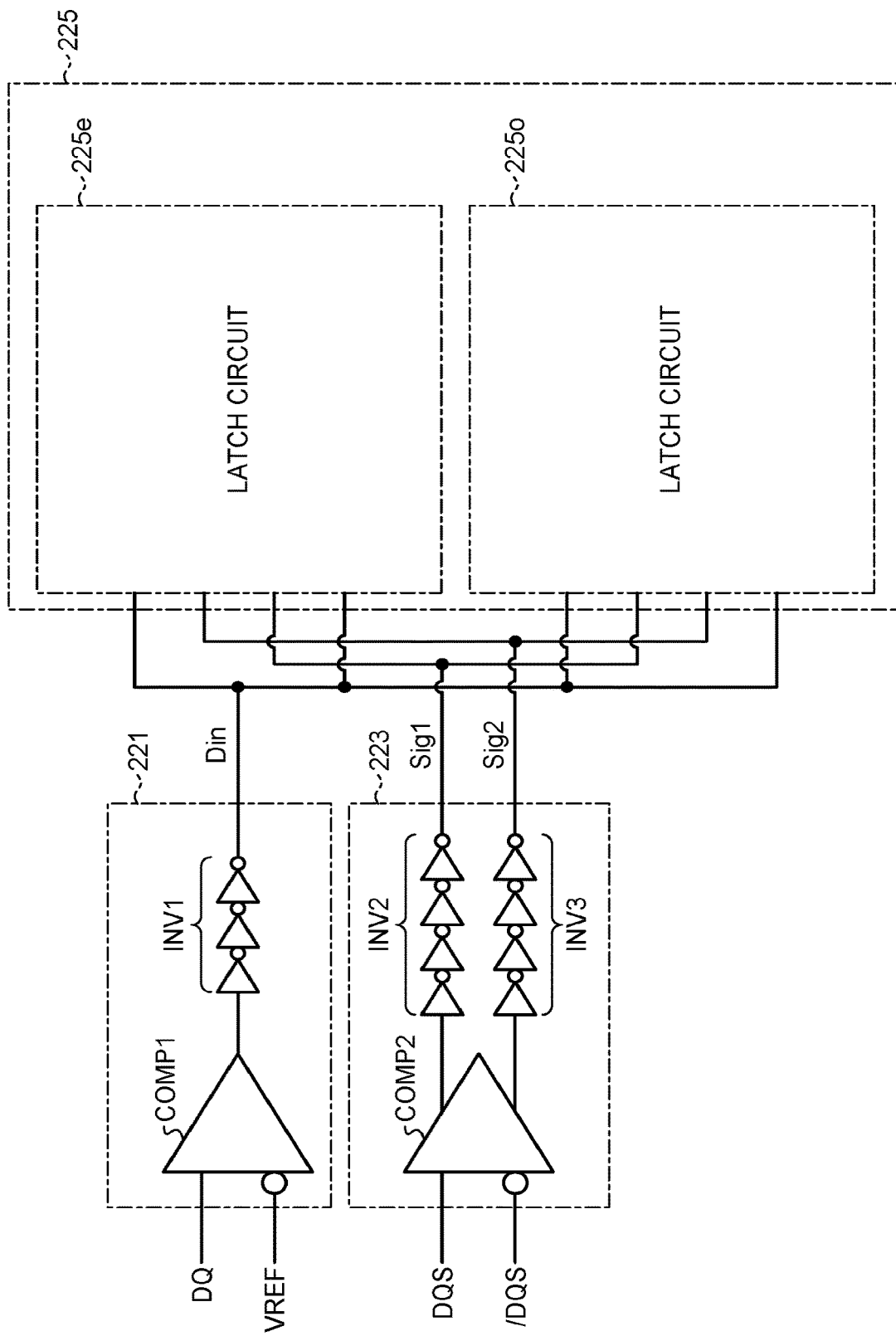
FIG. 4 is a diagram illustrating configurations of input circuits and a data latch according the embodiment.

The input circuits 221 and 223 and the data latch 225 in the input-output circuit 122 may be configured as illustrated in FIG. 4. FIG. 4 is an explanatory circuit diagram of the configurations of the input circuits 221 and 223 and the data latch 225.

The input circuit 221 includes a comparator COMP1 and an inverter group INV1. The input circuit 223 includes a comparator COMP2 and inverter groups INV2 and INV3.

The comparator COMP1 includes a first input end to be supplied with a data signal DQ, a second input end to be supplied with a reference signal VREF, and an output end connected to an input end of the inverter group INV1. The reference signal VREF is reference voltage having a constant value and used for amplification of the data signal DQ. The inverter group INV1 includes a plurality of inverters connected in series, and the inverter at a final stage has an output node functioning as an output end for output of a data signal Din. In an exemplary case where the inverter group INV1 includes an odd number of inverters, the inverter group INV1 generates a data signal Din having a phase obtained by inverting a phase of an output signal from the comparator COMP1, and outputs the data signal Din from the output end. In another exemplary case where the inverter group INV1 includes an even number of inverters, the inverter group INV1 generates a data signal Din substantially equal in phase to the output signal from the comparator COMP1, and outputs the data signal Din from the output end.

The comparator COMP2 includes a first input end to be supplied with the strobe signal DQS, a second input end to be supplied with the strobe signal /DQS, a first output end connected to an input end of the inverter group INV2, and a second output end connected to an input end of the inverter group INV3. The inverter groups INV2 and INV3 include output ends for output of the strobe signals Sig1 and Sig2, respectively. The inverter groups INV2 and INV3 respectively generate strobe signals Sig1 and Sig2 equal in phase to an output signal from the comparator COMP2 or the like. For example, the strobe signals Sig1 and Sig2 are opposite in phase.

The data latch 225 includes a latch circuit 225e and a latch circuit 225o. The latch circuit 225e and the latch circuit 225o are configured to receive the strobe signals Sig1 and Sig2 opposite in phase. Accordingly, the latch circuit 225e and the latch circuit 225o alternately latch data pieces adjacent to each other among data pieces included in the data signal Din. In a case where the latch circuit 225e latches data in an even number order included in the data signal Din, the latch circuit 225o latches data in an odd number order included in the data signal Din.

The input-output pin group 130 illustrated in FIGS. 2 and 3 includes a plurality of pins 130<7> to 130<0> corresponding to a plurality of data signals DQ<7> to DQ<0>. The plurality of pins 130<7> to 130<0> and the data latches 225 interpose the plurality of input circuits 221<7> to 221<0> being electrically connected.

The data signal DQ<0> inputted to the pin 130<0> is transmitted as the data signal Din<0> to the data latch 225 via the input circuit 221<0>. The data signal DQ<1> inputted to the pin 130<1> is transmitted as the data signal Din<1> to the data latch 225 via the input circuit 221<1> . . . . The data signal DQ<7> inputted to the pin 130<7> is transmitted as the data signal Din<7> to the data latch 225 via the input circuit 221<7>.

Figure 5:
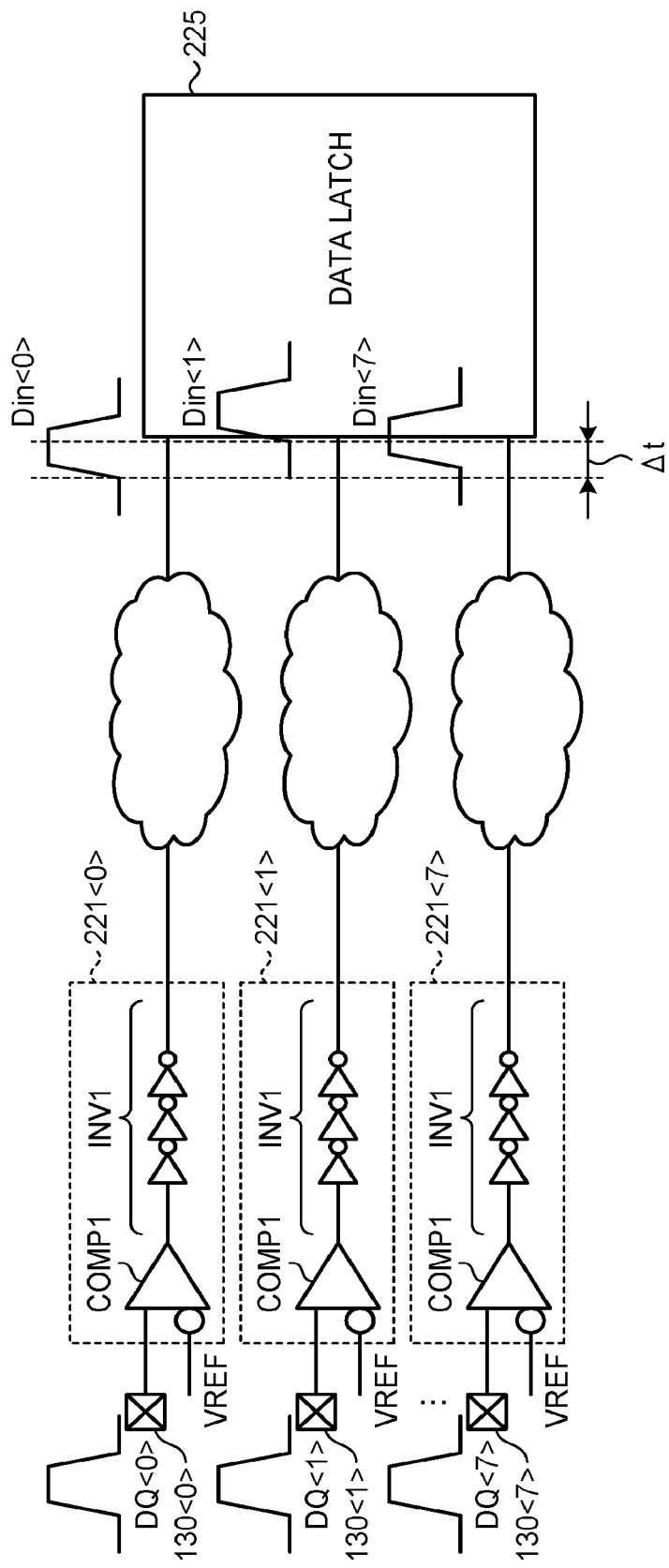
FIG. 5 is a diagram illustrating a configuration of pin skew according the embodiment.

As illustrated in FIG. 5, the plurality of data signals DQ<7> to DQ<0> externally inputted at substantially same timings to the plurality of pins 130<7> to 130<0> may reach as the data signals Din<7> to Din<0> to the data latch 225 via the plurality of input circuits 221<7> to 221<0> at timings different from one another. FIG. 5 exemplifies a case where, to reach the data latch 225, the data signal Din<0> has an earliest rising edge, the data signal Din<1> has a latest rising edge, and these rising edges have a timing shift Δt. This timing shift Δt will be called pin skew in a sense of shifts among the pins 130<7> to 130<0>. FIG. 5 is a diagram illustrating the pin skew.

The plurality of data signals Din<7> to Din<0> is latched in synchronization with the common data strobe signals Sig1 and Sig2 by the data latch 225. With large pin skew, an erroneous data value may be latched with insufficient setup time and hold time for data latching.

The pin skew has been inspected and found to be generated by variation among the pins 130<7> to 130<0> in delay quantity of the comparators COMP1 in the input circuits 221<7> to 221<0>.

In view of this, the comparator COMP1 in each of the input circuits 221<7> to 221<0> in the semiconductor integrated circuit 132 according to the present embodiment additionally includes a time constant adjusting circuit to enable change in delay quantity of the comparator COMP1, for reduction of the pin skew.

Focused on is an intermediate node between an input stage and an output stage of the comparator COMP1 in each of the input circuits 221<7> to 221<0>, and a time constant added to a portion between a load circuit at the input stage and the intermediate node may be adjusted by the time constant adjusting circuit. A pin skew value is evaluated during production of each of the input circuits 221<7> to 221<0>. In an exemplary case where the pin skew value is out of an allowable range, a data signal Din having a relatively late rising edge to reach the data latch 225 is specified in the plurality of data signals Din<7> to Din<0>. In the input circuit 221 corresponding to the data signal Din thus specified in the semiconductor integrated circuit 132, the time constant adjusting circuit in the comparator COMP1 controls to adjust signal transmission speed (i.e. inclination of a signal waveform upon potential transition) at the intermediate node by changing the time constant added to the portion between the load circuit and the intermediate node. This configuration advances the rising edge of the data signal Din to synchronize timings of the rising edges of the plurality of data signals Din<7> to Din<0> to reach the data latch 225. The pin skew may thus be decreased to be within the allowable range in the semiconductor integrated circuit 132.

Figure 6:
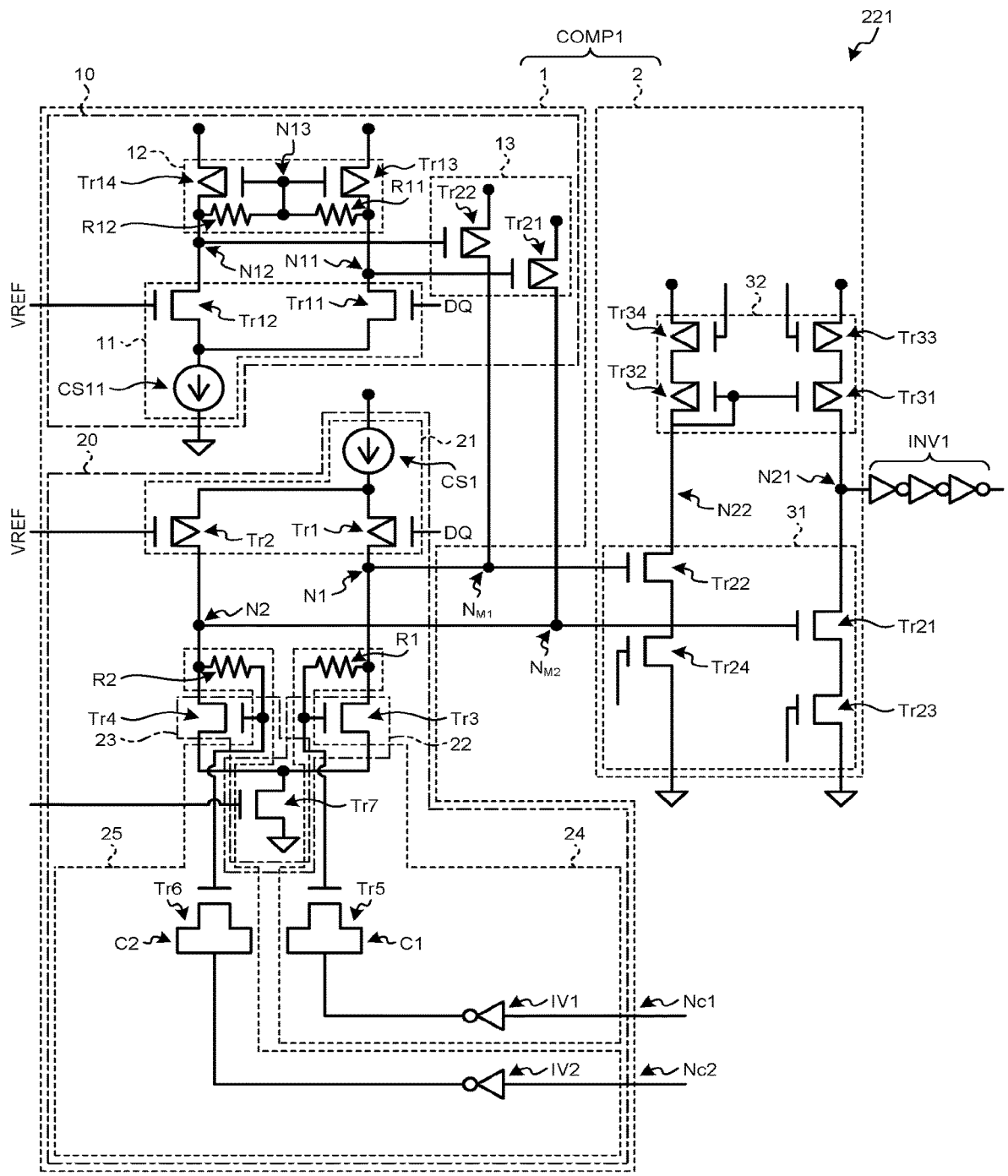
FIG. 6 is a diagram illustrating an exemplary configuration of a comparator in the input circuit according to the embodiment.

Each of the input circuits 221 may be configured as illustrated in FIG. 6 or the like. FIG. 6 illustrates an exemplary configuration of the input circuit 221. The comparator COMP1 in the input circuit 221 has an input stage 1 and an output stage 2.

The input stage 1 is electrically connected to the output stage 2 via an intermediate node $N_{M1}$ and an intermediate node $N_{M2}$.

The input stage 1 includes a differential amplifier circuit 10 and a differential amplifier circuit 20. The differential amplifier circuit 10 and the differential amplifier circuit 20 are provided to receive input signals at transistors reversed in polarity. An output signal from the differential amplifier circuit 10 and an output signal from the differential amplifier circuit 20 are synthesized at the intermediate nodes $N_{M1}$ and $N_{M2}$ to be transmitted to the output stage 2. In this case, the differential amplifier circuit 20 is additionally provided with time constant adjusting circuits 24 and 25 for increase in speed.

The differential amplifier circuit 10 includes a differential circuit 11, a load circuit 12, and a transfer circuit 13. The differential circuit 11 is disposed between ground potential and the load circuit 12. The load circuit 12 is disposed between the differential circuit 11 and power voltage. The transfer circuit 13 is disposed between the differential circuit 11, the load circuit 12, and the intermediate node $N_{M1}$, the intermediate node $N_{M2}$.

The transfer circuit 13 includes a transistor Tr21 and a transistor Tr22. The transistor Tr21 may be constituted by a PMOS transistor. The transistor Tr21 has a gate connected to a node N11. The node N11 is connected between the differential circuit 11 and the load circuit 12. The transistor Tr22 has a drain connected to the intermediate node $N_{M1}$ and a source connected to the power voltage. The transistor Tr22 may be constituted by a PMOS transistor. The transistor Tr22 has a gate connected to a node N12. The node N11 is connected between the differential circuit 11 and the load circuit 12. The transistor Tr22 has a drain connected to the intermediate node $N_{M2}$ and a source connected to the power voltage.

The differential circuit 11 includes a transistor Tr11, a transistor Tr12, and a current source CS11. The transistor Tr11 and the transistor Tr12 constitute a differential pair. Each of the transistor Tr11 and the transistor Tr12 may be constituted by an NMOS transistor. The transistor Tr11 has a gate to receive the data signal DQ, a drain electrically connected to the node N11, and a source electrically connected to a first end of the current source CS11. The transistor Tr12 has a gate to receive the reference signal VREF, a drain electrically connected to the node N12, and a source electrically connected to the first end of the current source CS11. The current source CS11 has a second end electrically connected to the ground potential.

The load circuit 12 includes a resistance element R11, a resistance element R12, a transistor Tr13, and a transistor Tr14. Each of the transistor Tr13 and the transistor Tr14 may be constituted by a PMOS transistor. The transistor Tr13 has a gate electrically connected to a node N13, a drain electrically connected to the node N11, and a source electrically connected to the power voltage. The transistor Tr14 has a gate electrically connected to the node N13, a drain electrically connected to the node N12, and a source electrically connected to the power voltage. The resistance element R11 has a first end connected to the drain of the transistor Tr13, and a second end connected to the node N13. The resistance element R12 has a first end connected to the drain of the transistor Tr14, and a second end connected to the node N13. In a case where the resistance element R11 and the resistance element R12 are substantially equal in resistance value, common voltage is generated at the node N13 and is applied to the gate of each of the transistor Tr13 and the transistor Tr14. FIG. 6 exemplarily illustrates the configuration, and each of the transistor Tr13 and the transistor Tr14 may be constituted by a current mirror. The configuration including the current mirror may be obtained by removing, from the configuration illustrated in FIG. 6, the resistance element R11 and the resistance element R12, and connecting the node N13 not to the drain of the transistor Tr14 but to the drain of the transistor Tr13.

The load circuit in the differential amplifier circuit 20 is divided to a differentially positive portion and a differentially negative portion for easier adjustment of the time constant between the load circuit and the intermediate node. The differential amplifier circuit 20 includes a differential circuit 21, a load circuit 22, a load circuit 23, the time constant adjusting circuit 24, and the time constant adjusting circuit 25. The differential circuit 21 is disposed between the power voltage and the load circuit 22, the load circuit 23. The load circuit 22 corresponds to a load circuit in the differentially positive portion, and is provided for the data signal DQ. The load circuit 23 corresponds to a load circuit in the differentially negative portion, and is provided for the reference signal VREF. Each of the load circuit 22 and the load circuit 23 is disposed between the differential circuit 21 and the ground potential.

The time constant adjusting circuit 24 is at least partially disposed between the load circuit 22 and the intermediate node $N_{M1}$, and is electrically connected between the load circuit 22 and the intermediate node $N_{M1}$. Accordingly, the time constant adjusting circuit 24 may adjust the time constant added between the load circuit 22 and the intermediate node $N_{M1}$, and may adjust speed of signal transmission from the differential amplifier circuits 10 and 20 to the output stage 2 via the intermediate node $N_{M1}$.

The time constant adjusting circuit 25 is at least partially disposed between the load circuit 23 and the intermediate node $N_{M2}$, and is electrically connected between the load circuit 23 and the intermediate node $N_{M2}$. Accordingly, the time constant adjusting circuit 25 may adjust the time constant added between the load circuit 23 and the intermediate node $N_{M2}$, and may adjust speed of signal transmission from the differential amplifier circuits 10 and 20 to the output stage 2 via the intermediate node $N_{M2}$.

The differential circuit 21 includes a transistor Tr1, a transistor Tr2, and a current source CS1. The transistor Tr1 and the transistor Tr2 constitute a differential pair. Each of the transistor Tr1 and the transistor Tr2 may be constituted by a PMOS transistor. The transistor Tr1 has a gate to receive the data signal DQ, a drain electrically connected to a node N1, and a source electrically connected to a first end of the current source CS1. The transistor Tr2 has a gate to receive the reference signal VREF, a drain electrically connected to a node N2, and a source electrically connected to the first end of the current source CS1. The current source CS1 has a second end electrically connected to the power voltage.

The load circuit 22 includes a transistor Tr3 and a transistor Tr7. Each of the transistor Tr3 and the transistor Tr7 may be constituted by an NMOS transistor. The transistor Tr3 has a gate to receive voltage supplied from the time constant adjusting circuit 24, a drain electrically connected to the node N1, and a source electrically connected to the transistor Tr7. The transistor Tr7 has a gate to receive predetermined bias voltage, a drain electrically connected to the transistor Tr3, and a source electrically connected to the ground potential.

The load circuit 23 includes a transistor Tr4 and the transistor Tr7. The transistor Tr7 is shared by the load circuit 22 and the load circuit 23. The transistor Tr4 may be constituted by an NMOS transistor. The transistor Tr4 has a gate to receive voltage supplied from the time constant adjusting circuit 25, a drain electrically connected to the node N2, and a source electrically connected to the transistor Tr7. FIG. 6 exemplarily illustrates the configuration, and the transistor Tr7 may alternatively be disposed between each of the load circuits 22 and 23 and the ground potential.

It should be noted that the gate of the transistor Tr3 and the gate of the transistor Tr4 may be electrically isolated from each other, and may be supplied with applied voltage from the time constant adjusting circuits 24 and 25, respectively.

The time constant adjusting circuit 24 includes a resistive element R1, a capacitive element C1, and an inverter IV1. The resistive element R1 has a predetermined resistance value. The resistive element R1 may be constituted by a resistance element, a transistor, or the like. When the resistive element R1 is constituted by a resistance element, the resistive element R1 may have a fixed resistance value. When the resistive element R1 is constituted by a transistor, the resistive element R1 may have an unfixed resistance value. The resistive element R1 has a first end electrically connected to the node N1, and a second end electrically connected to the gate of the transistor Tr3. The capacitive element C1 may be activated and deactivated. The capacitive element C1 has a first end electrically connected to the gate of the transistor Tr3, and a second end electrically connected to a control node Nc1 via the inverter IV1. The capacitive element C1 may be constituted by a capacitance element or a transistor. The capacitive element C1 includes a transistor Tr5 or the like. The transistor Tr5 has a gate functioning as the first end of the capacitive element C1, and a source and a drain commonly connected to function as the second end of the capacitive element C1. In the transistor Tr5, the gate is electrically connected to the gate of the transistor Tr3, and the source and the drain are electrically connected to the control node Nc1 via the inverter IV1. The inverter IV1 has an output node electrically connected to the second end of the capacitive element C1 (the source and the drain of the transistor Tr5), and an input node electrically connected to the control node Nc1. FIG. 6 exemplarily illustrates the configuration. In the transistor Tr5, the source and the drain may be commonly connected to function as the first end of the capacitive element C1, and the gate may function as the second end of the capacitive element C1. In this case, in the transistor Tr5, the source and the drain are electrically connected to the gate of the transistor Tr3, and the gate is electrically connected to the control node Nc1 via the inverter IV1. In the inverter IV1, the input node is electrically connected to the second end of the capacitive element C1 (the gate of the transistor Tr5), and the output node is electrically connected to the control node Nc1.

When the control node Nc1 is supplied with a control signal at an active level (e.g. H level), the time constant adjusting circuit 24 activates the capacitive element C1 and sets, to a first value, the time constant loaded between the load circuit 22 and the intermediate node $N_{M1}$. When the control node Nc1 is supplied with a control signal at a nonactive level (e.g. L level), the time constant adjusting circuit 24 deactivates the capacitive element C1 and sets, to a second value smaller than the first value, the time constant loaded between the load circuit 22 and the intermediate node $N_{M1}$.

The time constant adjusting circuit 25 includes a resistive element R2, a capacitive element C2, and an inverter IV2. The resistive element R2 has a fixed resistance value. The resistive element R2 is constituted by a resistance element or the like, and has a first end electrically connected to the node N2, and a second end electrically connected to the gate of the transistor Tr4. The capacitive element C2 may be activated and deactivated. The capacitive element C2 has a first end electrically connected to the gate of the transistor Tr4, and a second end electrically connected to a control node Nc2 via the inverter IV2. The capacitive element C2 includes a transistor Tr6. The transistor Tr6 has a gate functioning as the first end of the capacitive element C2, and a source and a drain commonly connected to function as the second end of the capacitive element C2. In the transistor Tr6, the gate is electrically connected to the gate of the transistor Tr4, and the source and the drain are electrically connected to the control node Nc2 via the inverter IV2. The inverter IV2 has an output node electrically connected to the second end of the capacitive element C2 (the source and the drain of the transistor Tr6), and an input node electrically connected to the control node Nc2.

When the control node Nc2 is supplied with a control signal at an active level (e.g. H level), the time constant adjusting circuit 25 activates the capacitive element C2 and sets, to a third value, the time constant loaded between the load circuit 23 and the intermediate node $N_{M2}$. When the control node Nc2 is supplied with a control signal at a nonactive level (e.g. L level), the time constant adjusting circuit 25 deactivates the capacitive element C2 and sets, to a fourth value smaller than the third value, the time constant loaded between the load circuit 23 and the intermediate node $N_{M2}$. The semiconductor integrated circuit 132 may control the control signal supplied to the time constant adjusting circuit 24 via the control node Nc1 and the control signal supplied to the time constant adjusting circuit 25 via the control node Nc2, as parameters independent from each other. Alternatively, the semiconductor integrated circuit 132 may automatically control the control signal from the control node Nc1 and the control signal from the control node Nc2 in accordance with a process condition or a circuit trimming result. In an exemplary case where the semiconductor integrated circuit 132 acquires a result (a DAC value) of canceling a DC amplitude offset (hereinafter, called a DC offset) between differential signals in the differential amplifier circuit 20, the semiconductor integrated circuit 132 may differentiate the control signal from the control node Nc1 and the control signal from the control node Nc2 in accordance with the DAC value.

The output stage 2 includes a differential circuit 31 and a load circuit 32. The differential circuit 31 is disposed between the ground potential and the load circuit 32. The load circuit 32 is disposed between the differential circuit 31 and the power voltage.

The differential circuit 31 includes the transistor Tr21, the transistor Tr22, a transistor Tr23, and a transistor Tr24. The transistor Tr21 and the transistor Tr22 constitute a differential pair. Each of the transistor Tr21 and the transistor Tr22 may be constituted by an NMOS transistor. In the transistor Tr21, the gate is electrically connected to the intermediate node $N_{M2}$, the drain is electrically connected to a node N21, and the source is electrically connected to the transistor Tr23. The node N21 constitutes an output node of the comparator COMP1. The transistor Tr23 is constituted by an NMOS transistor or the like, has a gate to receive bias voltage, and functions equivalently as a control switch. The transistor Tr23 has a source electrically connected to the ground potential, and a drain electrically connected to the transistor Tr21. In the transistor Tr22, the gate is electrically connected to the intermediate node $N_{M1}$, the drain is electrically connected to a node N22, and the source is electrically connected to the transistor Tr24. The node N22 is disposed between the differential circuit 31 and the load circuit 32. The transistor Tr24 is constituted by an NMOS transistor or the like, has a gate to receive bias voltage, and functions equivalently as a control switch. The transistor Tr24 has a source electrically connected to the ground potential, and a drain electrically connected to the transistor Tr22.

The load circuit 32 includes a transistor Tr31, a transistor Tr32, a transistor Tr33, and a transistor Tr34. The transistor Tr31 and the transistor Tr32 constitute a current mirror circuit. Each of the transistor Tr31 and the transistor Tr32 may be constituted by a PMOS transistor. The transistor Tr31 has a gate electrically connected to a gate and a drain of the transistor Tr32, a drain electrically connected to the node N21, and a source electrically connected to the transistor Tr33. The transistor Tr33 is constituted by a PMOS transistor or the like, has a gate to receive bias voltage, and functions equivalently as a control switch. The transistor Tr33 has a source electrically connected to the power voltage, and a drain electrically connected to the transistor Tr31. In the transistor Tr32, the gate is electrically connected to the drain and the gate of the transistor Tr31, the drain is electrically connected to the node N22, and a source is electrically connected to the transistor Tr34. The transistor Tr34 is constituted by a PMOS transistor or the like, has a gate to receive bias voltage, and functions equivalently as a control switch. The transistor Tr34 has a source electrically connected to the ground potential, and a drain electrically connected to the transistor Tr32.

Figure 7:
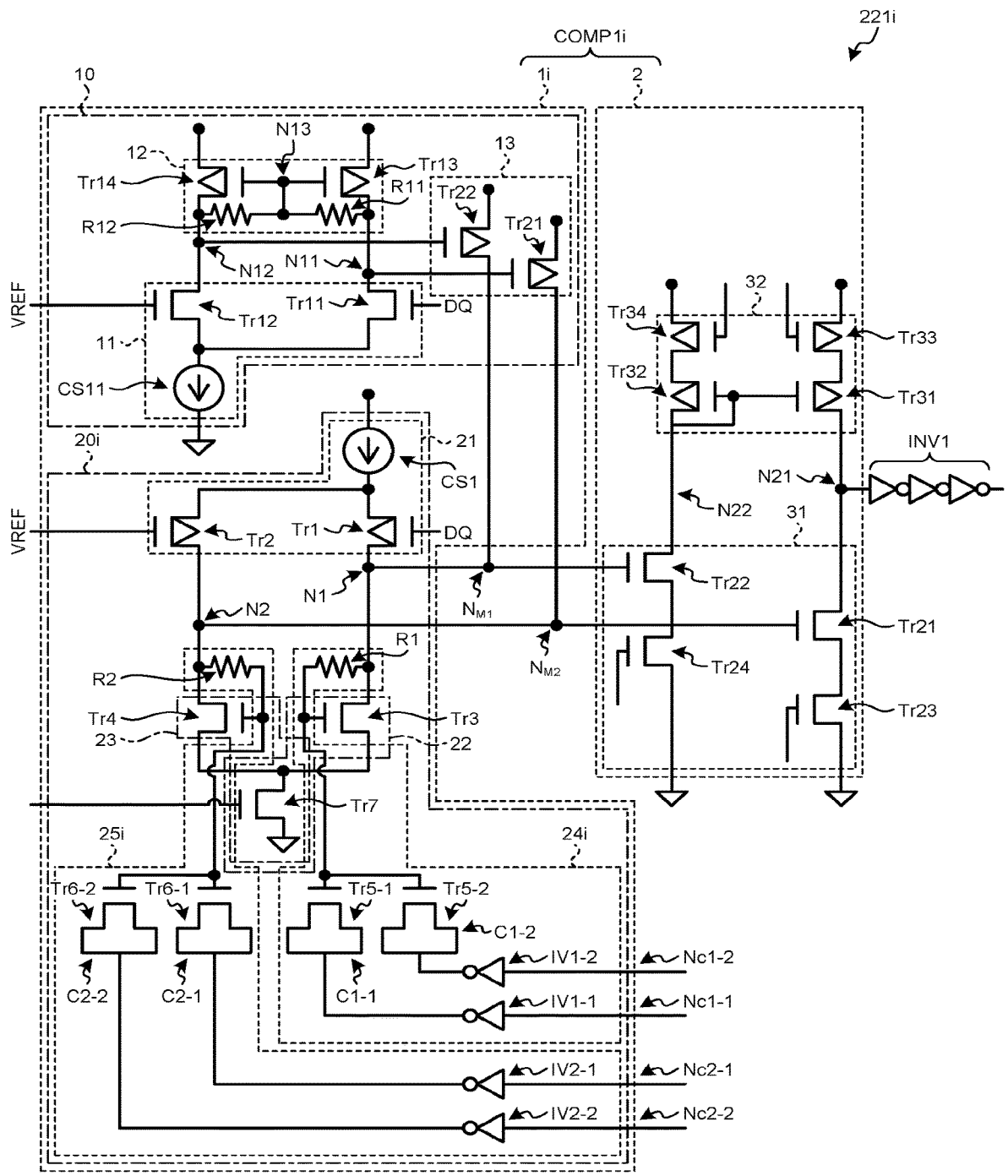
FIG. 7 is a diagram illustrating another exemplary configuration of a comparator in the input circuit according to the embodiment.

As alternatively illustrated in FIG. 7, at an input stage 1$i$ of the comparator COMP1 in each of input circuits 221$i$, time constant adjusting circuits 24$i$ and 25$i$ may each include a variable number of capacitive elements that may be activated and deactivated. FIG. 7 is a diagram illustrating another exemplary configuration of the comparator COMP1 in each of the input circuits 221$i$.

In a differential amplifier circuit 20$i$ in the input stage 1$i$, the time constant adjusting circuits 24$i$ and 25$i$ may include a plurality of capacitive elements C1-1 to C1-$n$ and a plurality of capacitive elements C2-1 to C2-$n$, and a plurality of inverters IV1-1 to IV1-$n$ and a plurality of inverters IV2-1 to IV2-$n$, respectively. The symbol n indicates an integer equal to or more than two. The time constant adjusting circuit 24$i$ is provided with a plurality of control nodes Nc1-1 to Nc1-$n$ corresponding to the plurality of capacitive elements C1-1 to C1-$n$. The capacitive elements C1-1 to C1-$n$ have first ends connected parallelly to the gate of the transistor Tr3 in the load circuit 22, and second ends connected to the control node Nc1 via the inverter IV1. The transistors Try in the capacitive elements C1 have the gates connected parallelly to the gate of the transistor Tr3 in the load circuit 22, and the source and the drain electrically connected to the control node Nc1 via the inverter IV1. The time constant adjusting circuit 25$i$ is provided with a plurality of control nodes Nc2-1 to Nc2-$n$ corresponding to the plurality of capacitive elements C2-1 to C2-$n$. The plurality of capacitive elements C2-1 to C2-$n$ has first ends connected parallelly to the gate of the transistor Tr4 in the load circuit 23, and second ends connected to the control node Nc2 via the inverter IV2. The transistors Tr6 in the capacitive elements C2 have the gates connected parallelly to the gate of the transistor Tr4 in the load circuit 23, and the source and the drain electrically connected to the control node Nc2 via the inverter IV2. FIG. 7 exemplarily illustrates a case of n=2.

Figure 8A:
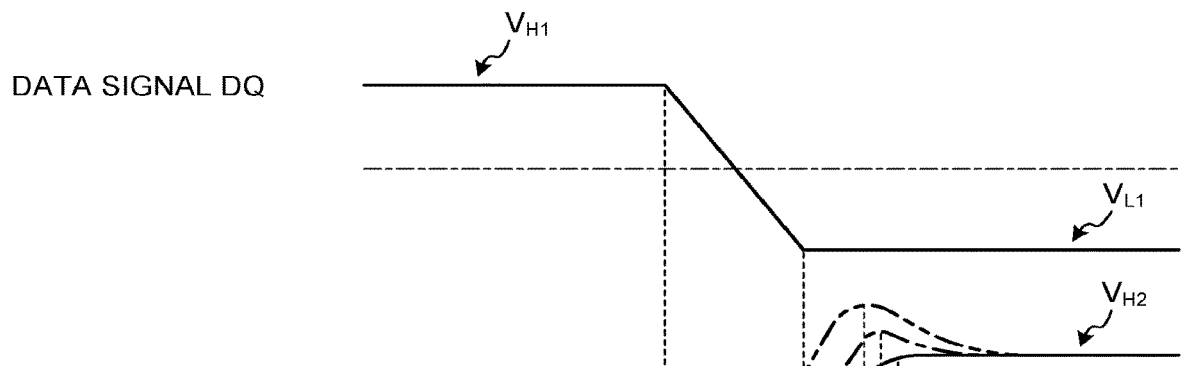
FIGS. 8A to 8C are waveform charts each illustrating operation of the input circuit according the embodiment.
Figure 8B:
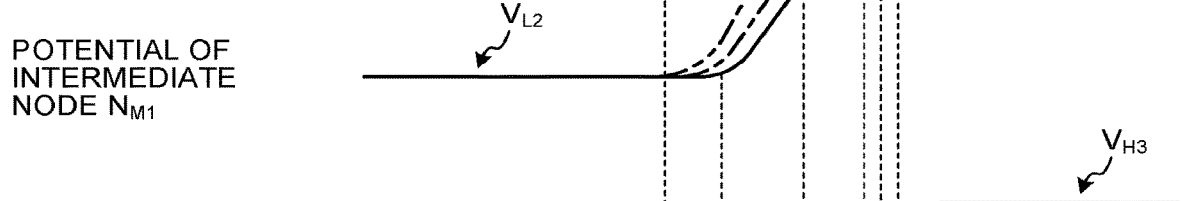
Figure 8C:
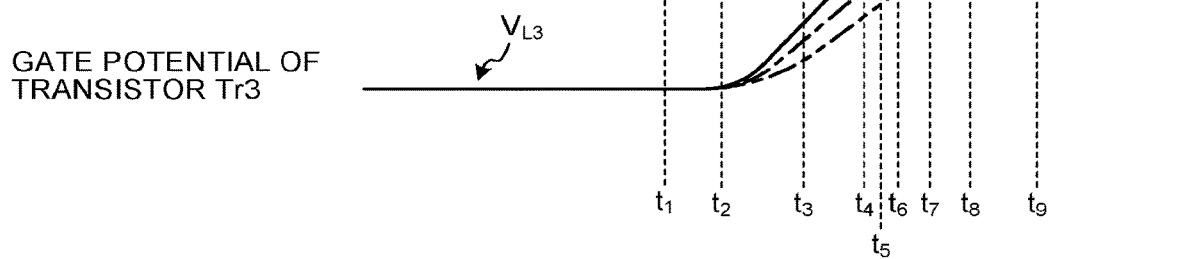
Figure 9A:
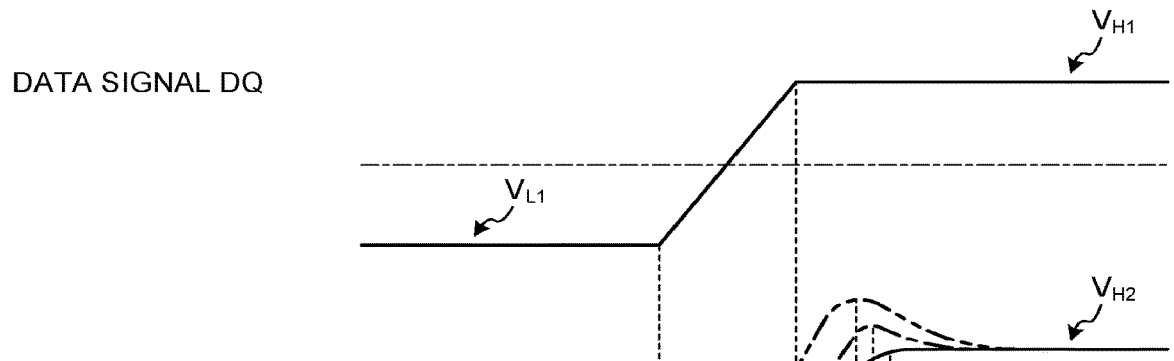
FIGS. 9A, 9C, and 9E are waveform charts each illustrating operation of the input circuit according the embodiment.
Figure 9C:
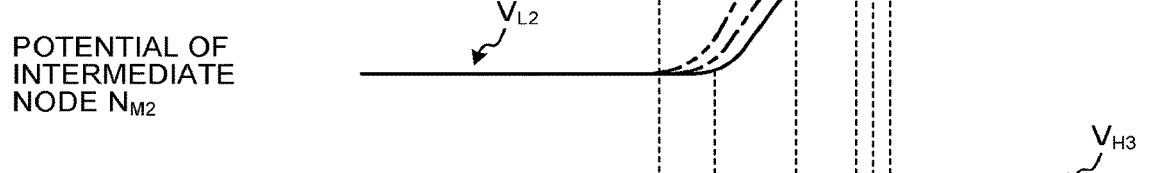
Figure 9E:
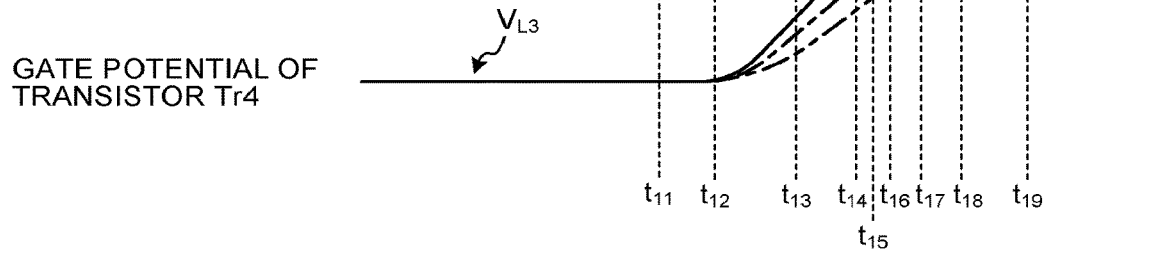
Figure 10:
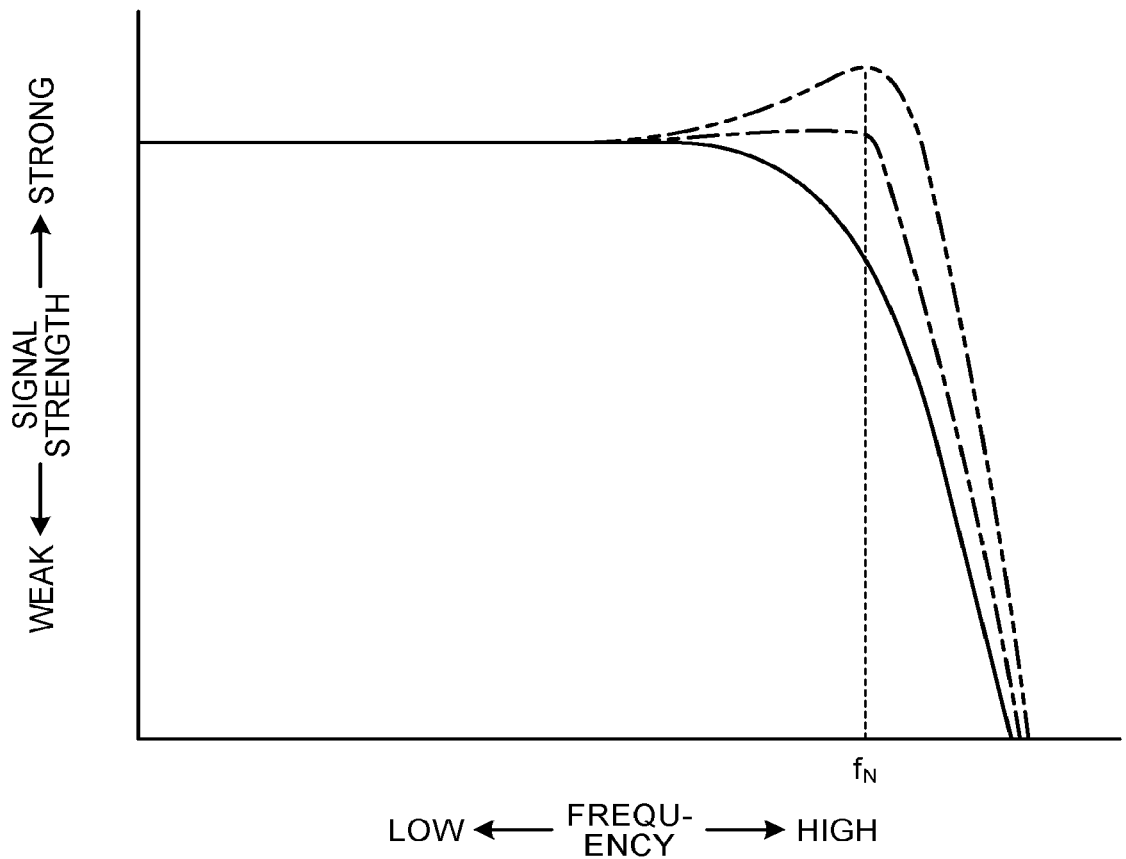
FIG. 10 is a graph illustrating frequency characteristics of the input circuit according the embodiment.

The semiconductor integrated circuit 132 evaluates the pin skew value during production of each of the input circuits 221<7> to 221<0> including the comparator COMP1 illustrated in FIG. 6 or the like. In a case where the pin skew value is out of the allowable range, a data signal Din having a relatively late rising edge to reach the data latch 225 is specified in the plurality of data signals Din<7> to Din<0>. The data signal Din having a relatively late rising edge tends to be deteriorated also in terms of frequency characteristics in comparison to the other data signals Din. In the input circuit 221 corresponding to the data signal Din thus specified in the semiconductor integrated circuit 132, the time constant adjusting circuit 24 in the comparator COMP1 changes the time constant added to the portion between the load circuits 22 and 23 and the intermediate nodes $N_{M1}$ and $N_{M2}$, and controls to improve signal characteristics from "characteristics illustrated by solid lines in FIGS. 8B, 9C, and 10" to "characteristics illustrated by dashed lines in FIGS. 8B, 9C, and 10". FIGS. 8A to 8C, 9A, 9C, and 9E are waveform charts each illustrating operation of the comparator COMP1 in the input circuit 221. FIG. 10 is a graph illustrating frequency characteristics of the comparator COMP1 in the input circuit 221. FIGS. 8A and 9A are waveform charts each illustrating change in signal level of the data signal DQ inputted to the differential circuit 21, FIG. 8B is a waveform chart illustrating change in potential of the intermediate node $N_{M1}$, FIG. 9C is a waveform chart illustrating change in potential of the intermediate node $N_{M2}$, FIG. 8C is a waveform chart illustrating change in potential of the gate in the transistor Tr3, and FIG. 9E is a waveform chart illustrating change in potential of the gate in the transistor Tr4.

During a period from timing t1 to timing t3 illustrated in FIG. 8A, the data signal DQ received by the comparator COMP1 has transition from an L level $V_{L1}$ to an H level $V_{H1}$. As illustrated in FIG. 8C, the gate of the transistor Tr3 in the load circuit 22 has transition from an L level $V_{L3}$ to an H level $V_{H3}$ during a later period from timing t2 to timing t7 in this case.

Assume a case where, uniformly in each of the input circuits 221<7> to 221<0>, the control node Nc1 is supplied with a control signal at a nonactive level (e.g. L level) to deactivate the capacitive element C1, and the time constant adjusting circuit 24 sets, to the first value, the time constant added between the load circuit 22 and the intermediate node $N_{M1}$. In this case, in the input circuit 221 corresponding to a late data signal Din, the potential of the intermediate node $N_{M1}$ has transition from an L level $V_{L2}$ to an H level $V_{H2}$ during a period from the timing t2 to timing t6 as illustrated by the solid line in FIG. 8B. The period from the timing t2 to the timing t6 has delay by delay quantity corresponding to the period from the timing t2 to the timing t7 having transition in potential of the gate of the transistor Tr3 in comparison to the period from the timing t1 to the timing t3 having transition of the data signal DQ. As illustrated by the solid line in FIG. 10, the output signal from the comparator COMP1 has frequency characteristics that tend to be attenuated in signal strength at a Nyquist frequency $f_N$ as a desired frequency in this case.

In contrast, in the input circuit 221 corresponding to the data signal Din specified as having a relatively late rising edge in the plurality of input circuits 221<7> to 221<0>, the control node Nc1 is selectively supplied with a control signal at an active level (e.g. H level) to activate the capacitive element C1, and the time constant adjusting circuit 24 sets, to the second value larger than the first value, the time constant added between the load circuit 22 and the intermediate node $N_{M1}$. The waveform of the potential of the intermediate node $N_{M1}$ may thus have steeper inclination as illustrated by the dashed line in FIG. 8B, and the potential of the intermediate node $N_{M1}$ has transition from the L level $V_{L2}$ to the H level $V_{H2}$ during an earlier period from the timing t2 to timing t5. Furthermore, the potential of the gate of the transistor Tr3 has gentler inclination as illustrated by a dashed line in FIG. 8C, and the potential of the gate of the transistor Tr3 has transition from the L level $V_{L3}$ to the H level $V_{H3}$ during a later period from the timing t2 to timing t8. As illustrated by the dashed line in FIG. 10, the output signal from the comparator COMP1 has frequency characteristics that may be suppressed in attenuation of signal strength around the Nyquist frequency $f_N$ as a desired frequency in this case.

Alternatively, during a period from timing t11 to timing t13 illustrated in FIG. 9A, the data signal DQ received by the comparator COMP1 has transition from the L level $V_{L1}$ to the H level $V_{H1}$. As illustrated in FIG. 9E, the gate of the transistor Tr4 in the load circuit 22 has transition from an L level $V_{H3}$ to an H level $V_{L3}$ during a later period from timing t12 to the timing t17 in this case.

Assume that, uniformly in each of the input circuits 221<7> to 221<0>, the control node Nc2 is supplied with a control signal at a nonactive level (e.g. L level) to deactivate the capacitive element C2, and the time constant adjusting circuit 25 sets, to the third value, the time constant added between the load circuit 23 and the intermediate node $N_{M2}$.

In this case, the potential of the intermediate node $N_{M2}$ in the input circuit 221 corresponding to a late data signal Din has transition from the L level $V_{L2}$ to the H level $V_{H2}$ during a period from the timing t12 to timing t16 as illustrated by the solid line in FIG. 9C. The period from the timing t12 to the timing t16 has delay by delay quantity corresponding to the period from the timing t12 to the timing t17 having transition in potential of the gate of the transistor Tr4 in comparison to the period from the timing t11 to the timing t13 having transition of the data signal DQ. As illustrated by the solid line in FIG. 10, the output signal from the comparator COMP1 has frequency characteristics that tend to be attenuated in signal strength at a Nyquist frequency $f_N$ as a desired frequency in this case.

In contrast, in the input circuit 221 corresponding to the data signal Din specified as having a relatively late rising edge in the plurality of input circuits 221<7> to 221<0>, the control node Nc2 is selectively supplied with a control signal at an active level (e.g. H level) to activate the capacitive element C2, and the time constant adjusting circuit 25 sets, to the fourth value larger than the third value, the time constant added between the load circuit 23 and the intermediate node $N_{M2}$. The waveform of the potential of the intermediate node $N_{M2}$ may thus have steeper inclination as illustrated by the dashed line in FIG. 9C, and the potential of the intermediate node $N_{M2}$ has transition from the L level $V_{L2}$ to the H level $V_{H2}$ during an earlier period from the timing t12 to timing t15. Furthermore, the potential of the gate of the transistor Tr4 has gentler inclination as illustrated by a dashed line in FIG. 9E, and the potential of the gate of the transistor Tr4 has transition from the L level $V_{L3}$ to the H level $V_{H3}$ during a later period from the timing t12 to timing t18. As illustrated by the dashed line in FIG. 10, the output signal from the comparator COMP1 has frequency characteristics that may be suppressed in attenuation of signal strength around the Nyquist frequency $f_N$ as a desired frequency in this case.

The data signal Din specified as having a relatively late rising edge in the plurality of data signals Din<7> to Din<0> may be increased in speed of signal transmission from the differential amplifier circuits 10 and 20 to the output stage 2 via the intermediate nodes $N_{M1}$ and $N_{M2}$. This leads to increase in speed of timing of the data signal Din supplied from the input circuit 221 to the data latch 225, as well as improvement in frequency characteristics. This configuration advances the rising edge of the data signal Din having a relatively late rising edge to reach the data latch 225 in the plurality of data signals Din<7> to Din<0>, to synchronize timings of the rising edges of the plurality of data signals Din<7> to Din<0> to reach the data latch 225. Moreover, the plurality of data signals Din<7> to Din<0> may be uniformed in terms of signal frequency characteristics.

The semiconductor integrated circuit 132 may alternatively evaluate the pin skew value during production of each of the input circuits 221*i* including a comparator COMP1*i* illustrated in FIG. 7 or the like. In a case where the pin skew value is out of the allowable range, a data signal Din having a late rising edge to reach the data latch 225 is specified in a multistage manner in the plurality of data signals Din<7> to Din<0>. The semiconductor integrated circuit 132 changes the number of control signals set to the active level in the plurality of control signals supplied to the control nodes Nc1 and Nc2 of the time constant adjusting circuits 24*i* and 25*i* in the comparator COMP1 in accordance with a number of lateness stages in the input circuit 221*i* corresponding to the specified data signal Din. In the input circuit 221*i* corresponding to the data signal Din specified as being late, the time constant added between the portion between the load circuits 22 and 23 and the intermediate nodes $N_{M1}$ and $N_{M2}$ is accordingly changed in a multistage manner in accordance with the number of lateness stages. In an exemplary case where the number of stages is n+1=3, the semiconductor integrated circuit 132 controls to improve signal characteristics in three stages from "the characteristics illustrated by the solid lines in FIGS. 8B, 9C, and 10" to "the characteristics illustrated by the dashed lines in FIGS. 8B, 9C, and 10" and further to "characteristics illustrated by two-dot chain lines in FIGS. 8B, 9C, and 10".

For example, during the period from the timing t1 to the timing t3 illustrated in FIG. 8A, the data signal DQ received by the comparator COMP1 has transition from the L level $V_{L1}$ to the H level $V_{H1}$. As illustrated in FIG. 8C, the gate of the transistor Tr3 in the load circuit 22 has transition from an L level $V_{L3}$ to an H level $V_{H3}$ during a later period from timing t2 to timing t7 in this case.

Assume a case where, uniformly in each of input circuits 221i<7> to 221i<0>, the control nodes Nc1-1 and Nc1-2 are supplied with a control signal at a nonactive level (e.g. L level) to deactivate the capacitive elements C1-1 and C1-2, and the time constant adjusting circuit 24i sets, to the first value, the time constant added between the load circuit 22 and the intermediate node $N_{M1}$. In this case, in the input circuit 221 corresponding to a late data signal Din, the potential of the intermediate node $N_{M1}$ has transition from an L level $V_{L2}$ to an H level $V_{H2}$ during a period from the timing t2 to timing t6 as illustrated by the solid line in FIG. 8B. The period from the timing t2 to the timing t6 has delay by delay quantity corresponding to the period from the timing t2 to the timing t7 having transition in potential of the gate of the transistor Tr3 in comparison to the period from the timing t1 to the timing t3 having transition of the data signal DQ. As illustrated by the solid line in FIG. 10, the output signal from the comparator COMP1 has frequency characteristics that tend to be attenuated in signal strength at a Nyquist frequency $f_N$ as a desired frequency in this case.

In contrast, in the input circuit 221i corresponding to the data signal Din specified as having a relatively late rising edge in the plurality of input circuits 221i<7> to 221i<0>, the control node Nc1-1 is selectively supplied with a control signal at an active level (e.g. H level) to activate the capacitive element C1-1, and the time constant adjusting circuit 24i sets, to the second value larger than the first value, the time constant added between the load circuit 22 and the intermediate node $N_{M1}$. The waveform of the potential of the intermediate node $N_{M1}$ may thus have steeper inclination as illustrated by the dashed line in FIG. 8B, and the potential of the intermediate node $N_{M1}$ has transition from the L level $V_{L3}$ the H level $V_{H3}$ during the earlier period from the timing t2 to timing t5. Furthermore, the potential of the gate of the transistor Tr3 has gentler inclination as illustrated by a dashed line in FIG. 8C, and the potential of the gate of the transistor Tr3 has transition from the L level $V_{L3}$ to the H level $V_{H3}$ during a later period from the timing t2 to timing t8. As illustrated by the dashed line in FIG. 10, the output signal from the comparator COMP1 has frequency characteristics that may be suppressed in attenuation of signal strength around the Nyquist frequency $f_N$ as a desired frequency in this case.

In the input circuit 221i corresponding to the data signal Din specified as having a still later rising edge in the plurality of input circuits 221i<7> to 221i<0>, the control nodes Nc1-1 and Nc1-2 are selectively supplied with a control signal at an active level (e.g. H level) to activate the capacitive elements C1-1 and C1-2, and the time constant adjusting circuit 24i sets, to a fifth value larger than the second value, the time constant added between the load circuit 22 and the intermediate node $N_{M1}$. The waveform of the potential of the intermediate node $N_{M1}$ may thus have steeper inclination as illustrated by the two-dot chain line in FIG. 8B, and the potential of the intermediate node $N_{M1}$ has transition from the L level $V_{L2}$ to the H level $V_{H2}$ during a still earlier period from the timing t2 to timing t4. Furthermore, the potential of the gate of the transistor Tr3 has gentler inclination as illustrated by a two-dot chain line in FIG. 8C, and the potential of the gate of the transistor Tr3 has transition from the L level $V_{L3}$ to the H level $V_{H3}$ during a later period from the timing t2 to timing t9. As illustrated by the two-dot chain line in FIG. 10, the output signal from the comparator COMP1 has frequency characteristics that may be further suppressed in attenuation of signal strength around the Nyquist frequency $f_N$ as a desired frequency in this case.

Alternatively, during a period from timing t11 to timing t13 illustrated in FIG. 9A, the data signal DQ received by the comparator COMP1 has transition from the L level $V_{L1}$ to the H level $V_{H1}$. As illustrated in FIG. 9E, the gate of the transistor Tr4 in the load circuit 22 has transition from an L level $V_{H3}$ to an H level $V_{L3}$ during a later period from timing t12 to the timing t17 in this case.

Assume that, uniformly in each of the input circuits 221<7> to 221<0>, the control node Nc2 is supplied with a control signal at a nonactive level (e.g. L level) to deactivate the capacitive element C2, and the time constant adjusting circuit 25 sets, to the third value, the time constant added between the load circuit 23 and the intermediate node $N_{M2}$. In this case, the potential of the intermediate node $N_{M2}$ in the input circuit 221 corresponding to a late data signal Din has transition from the L level $V_{L2}$ to the H level $V_{H2}$ during a period from the timing t12 to timing t16 as illustrated by the solid line in FIG. 9C. The period from the timing t12 to the timing t16 has delay by delay quantity corresponding to the period from the timing t12 to the timing t17 having transition in potential of the gate of the transistor Tr4 in comparison to the period from the timing t11 to the timing t13 having transition of the data signal DQ. As illustrated by the solid line in FIG. 10, the output signal from the comparator COMP1 has frequency characteristics that tend to be attenuated in signal strength at a Nyquist frequency $f_N$ as a desired frequency in this case.

In contrast, in the input circuit 221 corresponding to the data signal Din specified as having a relatively late rising edge in the plurality of input circuits 221<7> to 221<0>, the control node Nc2 is selectively supplied with a control signal at an active level (e.g. H level) to activate the capacitive element C2, and the time constant adjusting circuit 25 sets, to the fourth value larger than the third value, the time constant added between the load circuit 23 and the intermediate node $N_{M2}$. The waveform of the potential of the intermediate node $N_{M2}$ may thus have steeper inclination as illustrated by the dashed line in FIG. 9C, and the potential of the intermediate node $N_{M2}$ has transition from the L level $V_{L2}$ to the H level $V_{H2}$ during an earlier period from the timing t12 to timing t15. Furthermore, the potential of the gate of the transistor Tr4 has gentler inclination as illustrated by a dashed line in FIG. 9E, and the potential of the gate of the transistor Tr4 has transition from the L level $V_{L3}$ to the H level $V_{H3}$ during a later period from the timing t12 to timing t18. As illustrated by the dashed line in FIG. 10, the output signal from the comparator COMP1 has frequency characteristics that may be suppressed in attenuation of signal strength around the Nyquist frequency $f_N$ as a desired frequency in this case.

In the input circuit 221*i* corresponding to the data signal Din specified as having a still later rising edge in the plurality of input circuits 221*i*<7> to 221*i*<0>, the control nodes Nc2-1 and Nc2-2 are selectively supplied with a control signal at an active level (e.g. H level) to activate the capacitive elements C2-1 and C2-2, and the time constant adjusting circuit 25*i* sets, to a sixth value larger than the fourth value, the time constant added between the load circuit 23 and the intermediate node $N_{M2}$. The waveform of the potential of the intermediate node $N_{M2}$ may thus have steeper inclination as illustrated by the two-dot chain line in FIG. 9C, and the potential of the intermediate node $N_{M2}$ has transition from the H level $V_{H2}$ to the L level $V_{L2}$ during a still earlier period from the timing t12 to timing t14. Furthermore, the potential of the gate of the transistor Tr4 has gentler inclination as illustrated by a two-dot chain line in FIG. 9E, and the potential of the gate of the transistor Tr4 has transition from the H level $V_{H3}$ to the L level $V_{L3}$ during a later period from the timing t12 to timing t19. As illustrated by the two-dot chain line in FIG. 10, the output signal from the comparator COMP1 has frequency characteristics that may be further suppressed in attenuation of signal strength around the Nyquist frequency $f_N$ as a desired frequency in this case.

This configuration changes in a multistage manner timings of the rising edges of the plurality of data signals Din<7> to Din<0> to reach the data latch 225, to further synchronize the timings of the plurality of data signals Din. Moreover, the plurality of data signals Din<7> to Din<0> may be further uniformed in terms of signal frequency characteristics.

As described above, the comparator in each of the input circuits in the semiconductor integrated circuit 132 according to the present embodiment additionally includes the time constant adjusting circuit to enable change in delay quantity of the comparator. This configuration advances the rising edge of the data signal Din having a relatively late rising edge to reach the data latch 225 in the plurality of data signals Din<7> to Din<0>, to synchronize timings of the rising edges of the plurality of data signals Din<7> to Din<0> to reach the data latch 225. The pin skew may thus be decreased to be within the allowable range. Furthermore, the plurality of data signals Din<7> to Din<0> may be uniformed in terms of frequency characteristics and may be improved in signal quality.

Figure 11:
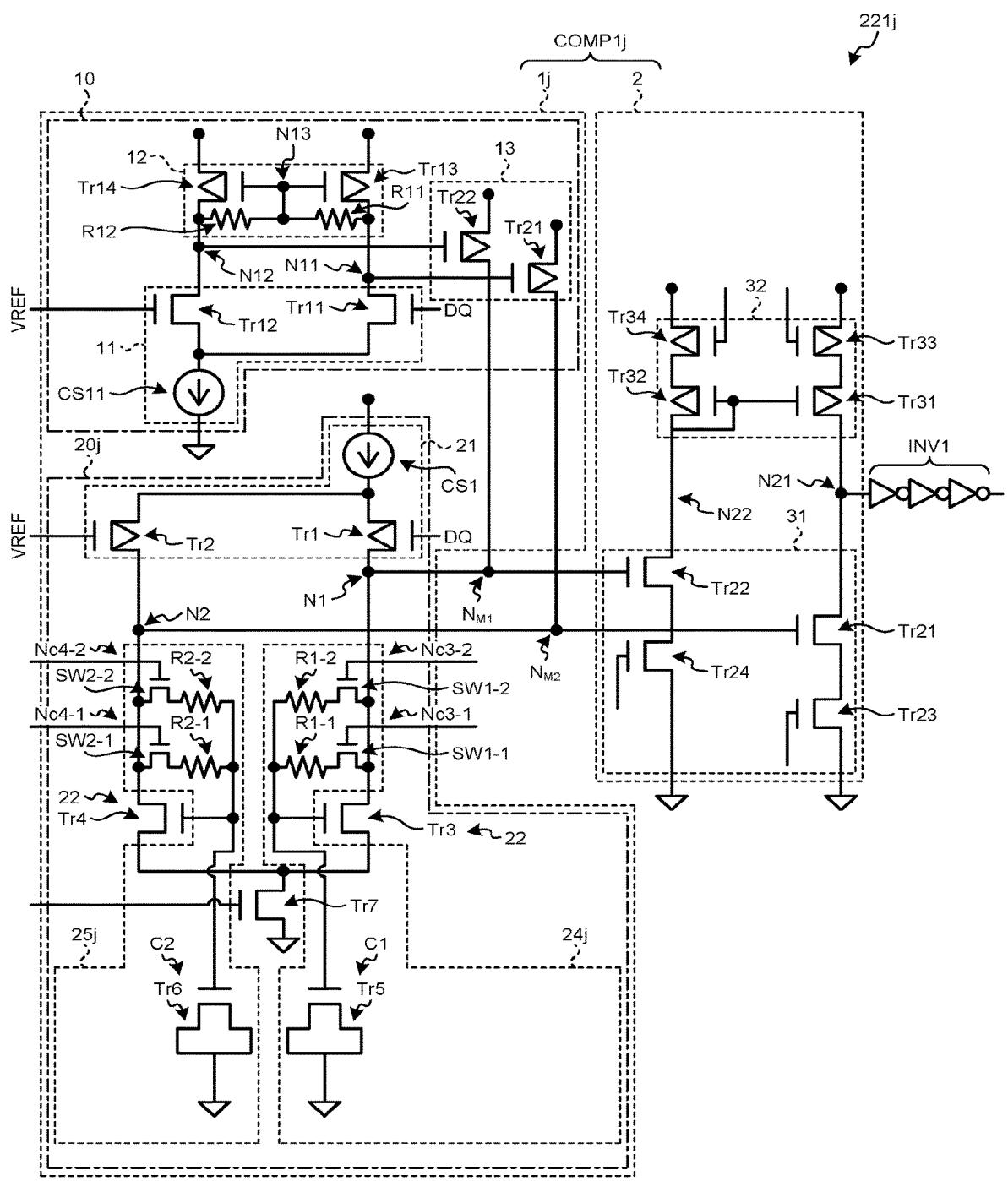
FIG. 11 is a diagram illustrating an exemplary configuration of a comparator in an input circuit according to a first modification example of the embodiment.

As alternatively illustrated in FIG. 11, in an input stage 1*j* of a comparator COMP1*j* in each of input circuits 221*j*, time constant adjusting circuits 24*j* and 25*j* may each include resistive elements in place of the capacitive elements that may be activated and deactivated, and the number of the resistive elements that may be activated and deactivated may be variable. FIG. 11 is a diagram illustrating a configuration of the comparator COMP1*j* in the input circuit 221*j* according to a first modification example of the embodiment.

In a differential amplifier circuit 20*j* in the input stage 1*j*, the time constant adjusting circuits 24*j* and 25*j* may include a plurality of resistive elements R1-1 to R1-*n* and a plurality of resistive elements R2-1 to R2-*n*, and a plurality of switches SW1-1 to SW1-*n* and a plurality of switches SW2-1 to SW2-*n*, respectively. The symbol n indicates an integer equal to or more than two. The time constant adjusting circuit 24*j* is provided with a plurality of control nodes Nc3-1 to Nc3-*n* corresponding to the plurality of resistive elements R1-1 to R1-*n*. The plurality of control nodes Nc3-1 to Nc3-*n* is electrically connected to control terminals of the plurality of switches SW1-1 to SW1-*n*. The resistive elements R1-1 to R1-*n* have first ends connected parallelly to the gate of the transistor Tr3 in the load circuit 22, and second ends connected to the intermediate node $N_{M1}$ via the switches SW1. The time constant adjusting circuit 25*j* is provided with a plurality of control nodes Nc4-1 to Nc4-*n* corresponding to the plurality of resistive elements R2-1 to R2-*n*. The plurality of control nodes Nc4-1 to Nc4-*n* is electrically connected to control terminals of the plurality of switches SW2-1 to SW2-*n*. The plurality of resistive elements R2-1 to C2-*n* has first ends connected parallelly to the gate of the transistor Tr4 in the load circuit 23, and second ends connected to the intermediate node $N_{M2}$ via the switches SW2. In the transistor Tr*y* in the capacitive element C1, the gate as the first end is connected to the gate of the transistor Tr3, and the source and the drain as the second end are connected to reference potential (e.g. the ground potential), and is constantly activated. In the transistor Tr6 in the capacitive element C2, the gate as the first end is connected to the gate of the transistor Tr4, and the source and the drain as the second end are connected to the reference potential (e.g. the ground potential), and is constantly activated. FIG. 11 exemplarily illustrates the case of n=2.

The semiconductor integrated circuit 132 accordingly evaluates the pin skew value during production of each of the input circuits 221*j*. In a case where the pin skew value is out of the allowable range, a data signal Din having a late rising edge to reach the data latch 225 is specified in a multistage manner in the plurality of data signals Din<7> to Din<0>. The semiconductor integrated circuit 132 changes the number of control signals set to the active level in the plurality of control signals supplied to the control nodes Nc3 and Nc4 of the time constant adjusting circuits 24*j* and 25*j* in the comparator COMP1 in accordance with a number of lateness stages in the input circuit 221*j* corresponding to the specified data signal Din. In the input circuit 221*j* corresponding to the data signal Din specified as being late, the time constant added between the portion between the load circuits 22 and 23 and the intermediate nodes $N_{M1}$ and $N_{M2}$ is accordingly changed in accordance with the number of lateness stages, for control to improve signal characteristics as illustrated in FIGS. 8A to 8C, 9A, 9C, 9E, and 10. This configuration further synchronizes timings of the rising edges of the plurality of data signals Din<7> to Din<0> to reach the data latch 225.

Though not illustrated, alternatively, the configuration illustrated in FIG. 6 or 7 and the configuration illustrated in FIG. 11 may be combined together. In the input stage of the comparator in each of input circuits, the time constant adjusting circuits may include both capacitive elements and resistive elements that may be activated and deactivated, and the numbers of the capacitive elements and resistive elements that may be activated and deactivated may be variable. Also in this configuration, the time constant added between the portion between the load circuits 22 and 23 and the intermediate nodes $N_{M1}$ and $N_{M2}$ may be changed for control to improve signal characteristics as illustrated in FIGS. 8A to 8C, 9A, 9C, 9E, and 10. This configuration further synchronizes timings of the rising edges of the plurality of data signals Din<7> to Din<0> to reach the latch circuit 225 in the data latch 225.

Figure 12:
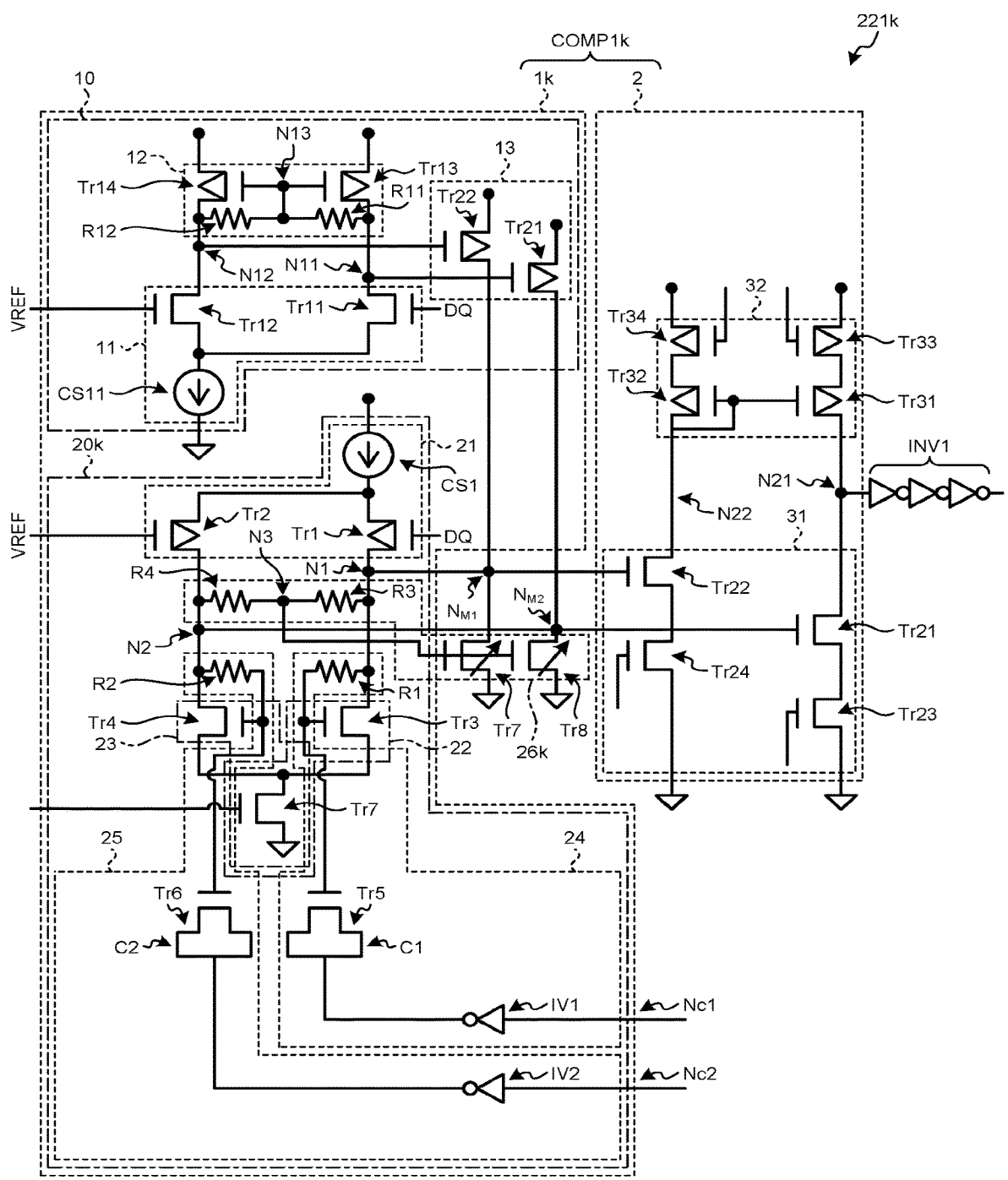
FIG. 12 is a diagram illustrating an exemplary configuration of a comparator in an input circuit according to a second modification example of the embodiment.

Alternatively as illustrated in FIG. 12, a DC offset to be mixed in DC manner to a signal may be suppressed in an input stage 1*k* of a comparator COMP1*k* in each of input circuits 221*k*. FIG. 12 is a diagram illustrating a configuration of the comparator COMP1k in the input circuit 221k according to a second modification example of the embodiment.

In the input stage 1k, a differential amplifier circuit 20k additionally includes an offset suppression circuit 26k. That is, the time constant adjusting circuits 24 and 25 adjust the time constant added between the gates of the transistors Tr3 and Tr4 in the load circuits 22 and 23 and the intermediate nodes $N_{M1}$ and $N_{M2}$. Due to influence of variation quantity in capacitance of the gates in the transistors Tr3 and Tr4, a DC offset may be mixed to a signal transmitted from the differential amplifier circuits 10 and 20k to the output stage 2. In order for suppression of influence of the DC offset, the differential amplifier circuit 20k additionally includes the offset suppression circuit 26k. The offset suppression circuit 26k is electrically connected between the time constant adjusting circuits 24 and 25 and the intermediate nodes $N_{M1}$ and $N_{M2}$.

The offset suppression circuit 26k includes a resistance element R3, a resistance element R4, the transistor Tr7, and a transistor Tr8. Each of the transistor Tr7 and the transistor Tr8 may be constituted by an NMOS transistor. In the transistor Tr7, the gate is electrically connected to a node N3, the drain is electrically connected to the intermediate node $N_{M1}$, and the source is electrically connected to the ground potential. The transistor Tr8 has a gate electrically connected to the node N3, a drain electrically connected to the intermediate node $N_{M2}$, and a source electrically connected to the ground potential. Each of the transistor Tr7 and the transistor Tr8 may be configured to be variable in dimensions in accordance with an external control signal. For example, each of the transistor Tr7 and the transistor Tr8 may include a plurality of transistors that is dimensionally different, is parallelly connected, and is disposed between the intermediate nodes $N_{M1}$ and $N_{M2}$ and the ground potential, and any of the plurality of transistors may be activated in accordance with the control signal. The resistance element R3 has a first end electrically connected to the intermediate node $N_{M1}$ and the drain of the transistor Tr3, and a second end electrically connected to the node N3. The resistance element R4 has a first end electrically connected to the intermediate node $N_{M2}$ and the drain of the transistor Tr4, and a second end electrically connected to the node N3. In a case where the resistance element R11 and the resistance element R12 are substantially equal in resistance value, common voltage is generated at the node N13 and the common voltage is applied to the gate of each of the transistor Tr7 and the transistor Tr8.

Accordingly, the time constant added between the portion between the load circuits 22 and 23 and the intermediate nodes $N_{M1}$ and $N_{M2}$ is selectively changed in the input circuit 221k corresponding to the data signal Din specified as having a relatively late rising edge in the plurality of input circuits 221k<7> to 221k<0>. In this case, the transistor Tr7 and the transistor Tr8 may suppress the DC offset with reference to the common voltage, for suppression of influence of adjustment of the time constant by the time constant adjusting circuits 24 and 25.

Figure 13:
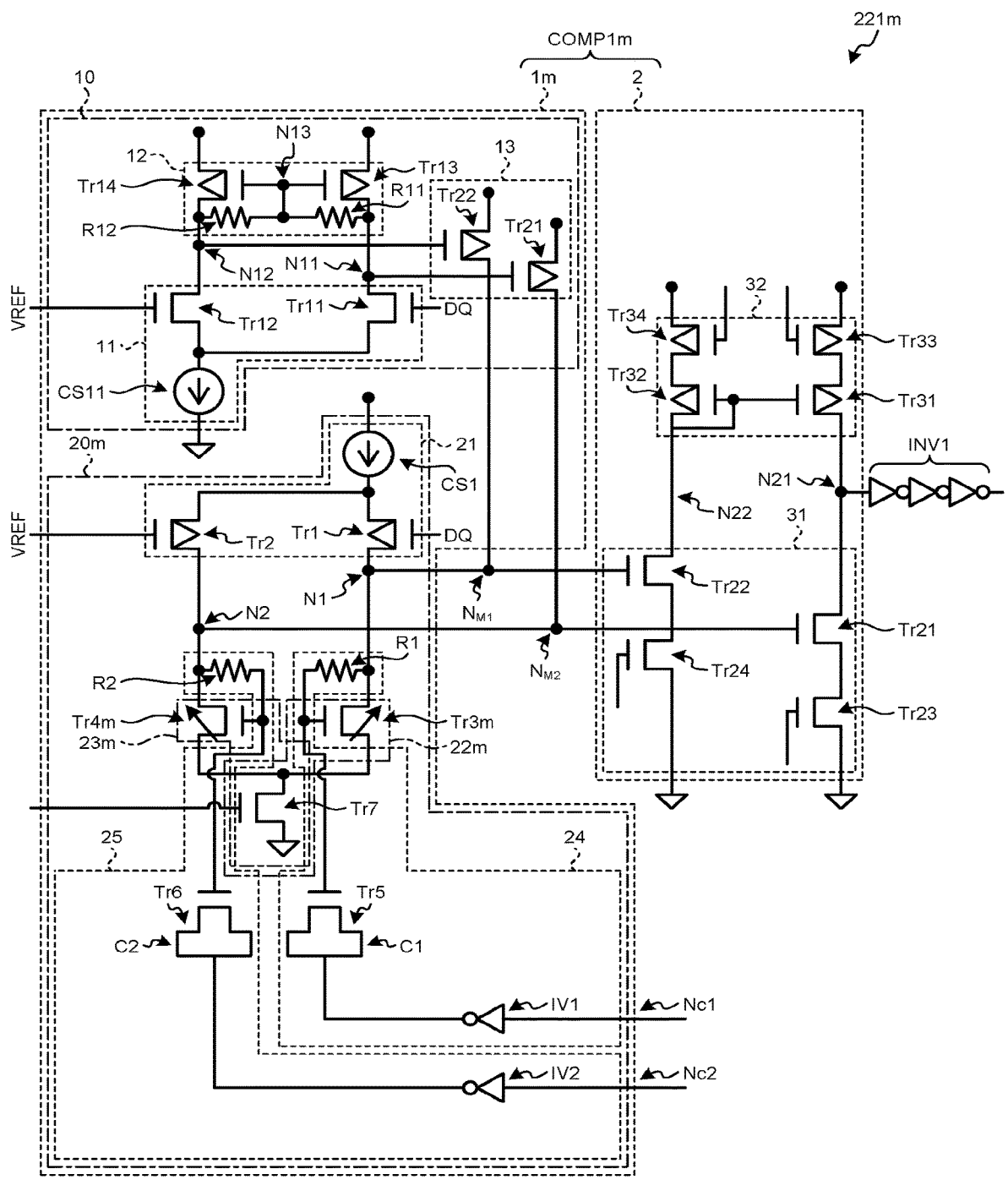
FIG. 13 is a diagram illustrating an exemplary configuration of a comparator in an input circuit according to a third modification example of the embodiment.

Alternatively as illustrated in FIG. 13, in an input stage 1m of a comparator COMP1m in each of input circuits 221m, the offset suppression circuit 26k and the load circuits 22 and 23 may be communalized to constitute load circuits 22m and 23m. FIG. 13 is a diagram illustrating a configuration of the comparator COMP1m in the input circuit 221m according to a third modification example of the embodiment.

In a differential amplifier circuit 20m in the input stage 1m, the load circuit 22m includes a transistor Tr3m in place of the transistor Tr3 (see FIG. 6). The transistor Tr3m may be configured to be dimensionally variable in accordance with an external control signal. For example, the transistor Tr3m may include a plurality of transistors that is dimensionally different, is parallelly connected, and is disposed between the node N1 and the drain of the transistor Tr7, and any of the plurality of transistors may be activated in accordance with the control signal.

The load circuit 23m includes a transistor Tr4m in place of the transistor Tr4 (see FIG. 6). The transistor Tr4m may be configured to be dimensionally variable in accordance with an external control signal. For example, the transistor Tr4m may include a plurality of transistors that is dimensionally different, is parallelly connected, and is disposed between the node N2 and the drain of the transistor Tr7, and any of the plurality of transistors may be activated in accordance with the control signal.

Accordingly, the time constant added between the portion between the load circuits 22 and 23 and the intermediate nodes $N_{M1}$ and $N_{M2}$ is selectively changed in the input circuit 221m corresponding to the data signal Din specified as having a relatively late rising edge in the plurality of input circuits 221m<7> to 221m<0>. In this case, the transistor Tr3m and the transistor Tr4m may suppress the DC offset, for suppression of influence of adjustment of the time constant by the time constant adjusting circuits 24 and 25.

Figure 14:
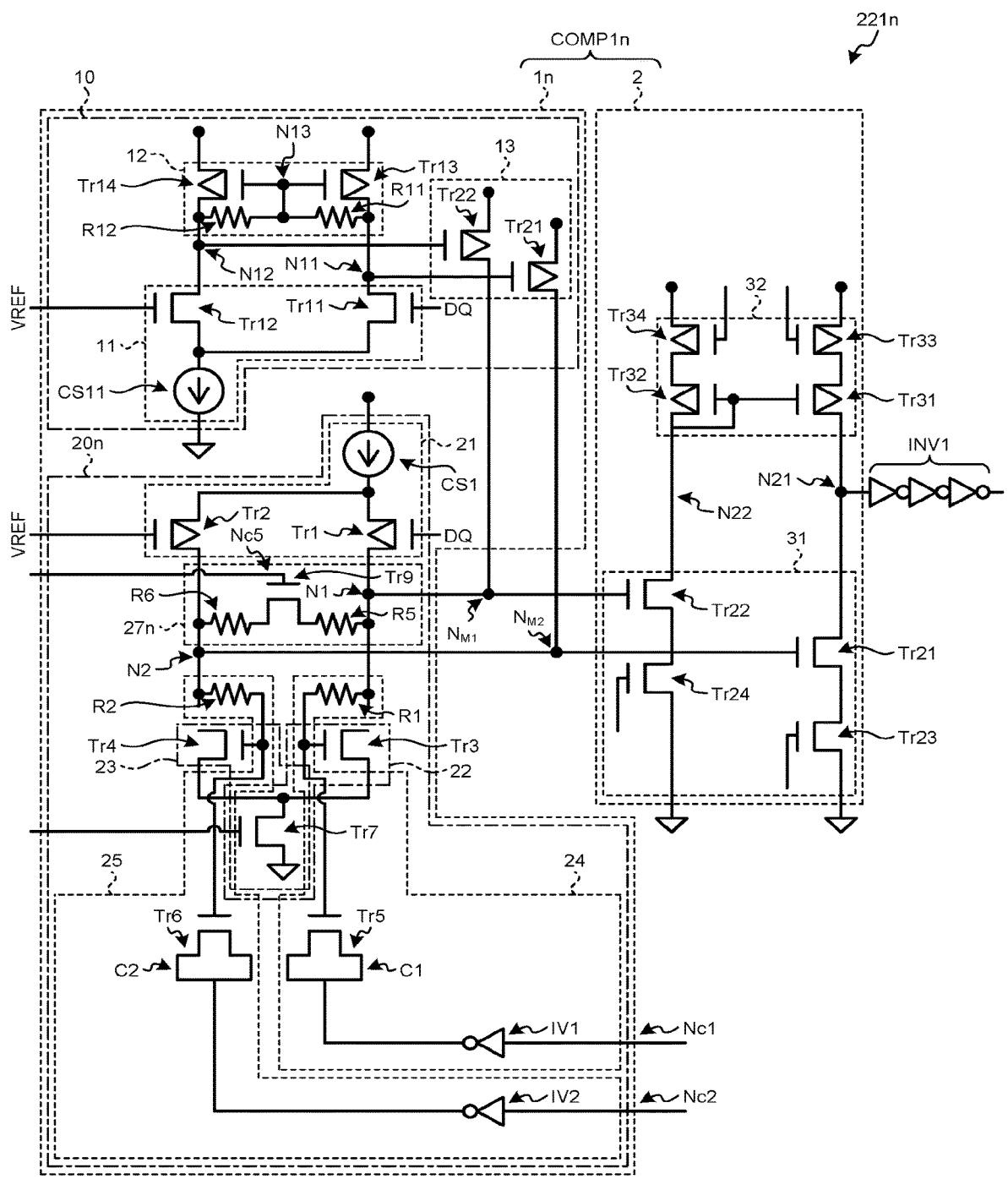
FIG. 14 is a diagram illustrating an exemplary configuration of a comparator in an input circuit according to a fourth modification example of the embodiment.

Alternatively as illustrated in FIG. 14, signal amplitude may be adjusted in an input stage 1n of a comparator COMP1n in each of input circuits 221n. FIG. 14 is a diagram illustrating a configuration of the comparator COMP1n in the input circuit 221n according to a fourth modification example of the embodiment.

In the input stage 1n, a differential amplifier circuit 20n additionally includes an amplitude adjusting circuit 27n. That is, the time constant adjusting circuits 24 and 25 adjust the time constant added between the gates of the transistors Tr3 and Tr4 in the load circuits 22 and 23 and the intermediate nodes $N_{M1}$ and $N_{M2}$. This enables decrease in signal delay quantity and improvement in frequency characteristics. In order for further improvement of the frequency characteristics, the amplitude adjusting circuit 27n is additionally provided to adjust amplitude of a signal at the intermediate nodes $N_{M1}$ and $N_{M2}$. The amplitude adjusting circuit 27n is electrically connected between the time constant adjusting circuits 24 and 25 and the intermediate nodes $N_{M1}$ and $N_{M2}$.

The amplitude adjusting circuit 27n includes a resistance element R5, a resistance element R6, and a transistor Tr9. The resistance element R5 has a first end electrically connected to the intermediate node $N_{M1}$ and the drain of the transistor Tr3, and a second end electrically connected to the transistor Tr9. The resistance element R6 has a first end electrically connected to the intermediate node $N_{M2}$ and the drain of the transistor Tr4, and a second end electrically connected to the transistor Tr9. The transistor Tr9 may be constituted by an NMOS transistor. The transistor Tr9 has a gate electrically connected to a control node Nc5, a drain electrically connected to the resistance element R5, and a source electrically connected to the resistance element R6. The transistor Tr9 may be turned on in accordance with external supply, to the control node Nc5, of a control signal at an active level (e.g. H level), connect the resistance element R5 and the resistance element R6, and add a differentially positive signal and a differentially negative signal to decrease amplitude of these signals.

Accordingly, the time constant added between the portion between the load circuits 22 and 23 and the intermediate nodes $N_{M1}$ and $N_{M2}$ is selectively changed in the input circuit 221*n* corresponding to the data signal Din specified as having a relatively late rising edge in the plurality of input circuits 221*n*<7> to 221*n*<0>, and the intermediate nodes $N_{M1}$ and $N_{M2}$ have change in signal amplitude. This enables amplitude suppression for a signal larger in time constant delay than any other signal and suppression of deterioration in frequency characteristics, and thus enables further improvement in frequency characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   an input circuit including an input stage, and an output stage electrically connected to the input stage via a first node, and a second node, wherein
   the input stage includes
   a first transistor including a gate that receives an input signal,
   a second transistor including a gate that receives a reference signal,
   a third transistor disposed adjacent to a drain of the first transistor,
   a fourth transistor disposed adjacent to a drain of the second transistor,
   a first time constant adjusting circuit electrically connected between a gate of the third transistor and the first node, the first time constant adjusting circuit having a variable load value, and
   a second time constant adjusting circuit electrically connected between a gate of the fourth transistor and the second node, the second time constant adjusting circuit having a variable load value.

2. The semiconductor integrated circuit according to claim 1, wherein
   the first time constant adjusting circuit includes
   a first capacitive element having a first end electrically connected to the gate of the third transistor, and
   a first control node electrically connected to a second end of the first capacitive element, and
   the second time constant adjusting circuit includes
   a second capacitive element having a first end electrically connected to the gate of the fourth transistor, and
   a second control node electrically connected to a second end of the second capacitive element.

3. The semiconductor integrated circuit according to claim 2, wherein
   the first capacitive element includes
   a fifth transistor having a gate connected to the gate of the third transistor, and a drain and a source connected to the first control node, and
   the second capacitive element includes
   a sixth transistor having a gate connected to the gate of the fourth transistor, and a drain and a source connected to the second control node.

4. The semiconductor integrated circuit according to claim 2, wherein
   the first capacitive element includes
   a fifth transistor having a drain and a source connected to the gate of the third transistor, and a gate connected to the first control node, and
   the second capacitive element includes
   a sixth transistor having a drain and a source connected to the gate of the fourth transistor, and a gate connected to the second control node.

5. The semiconductor integrated circuit according to claim 2, wherein
   the first time constant adjusting circuit further includes a first resistive element connected between the gate of the third transistor and the first node, and
   the second time constant adjusting circuit further includes a second resistive element connected between the gate of the fourth transistor and the second node.

6. The semiconductor integrated circuit according to claim 2, wherein
   the first time constant adjusting circuit further includes a first inverter electrically connected between the first capacitive element and the first control node, and
   the second time constant adjusting circuit further includes a second inverter electrically connected between the second capacitive element and the second control node.

7. The semiconductor integrated circuit according to claim 1, wherein
   the first time constant adjusting circuit includes
   a plurality of first capacitive elements having first ends connected parallelly to the gate of the third transistor, and
   a plurality of first control nodes electrically connected to second ends of the first capacitive elements, and
   the second time constant adjusting circuit includes
   a plurality of second capacitive elements having first ends connected parallelly to the gate of the fourth transistor, and
   a plurality of second control nodes electrically connected to second ends of the plurality of second capacitive elements.

8. The semiconductor integrated circuit according to claim 7, wherein
   each of the first capacitive elements includes
   a fifth transistor having a gate connected to the gate of the third transistor, and a drain and a source connected to the first control nodes, and
   each of the second capacitive elements includes
   a sixth transistor having a gate connected to the gate of the fourth transistor, and a drain and a source connected to the second control nodes.

9. The semiconductor integrated circuit according to claim 7, wherein
   each of the first capacitive elements includes
   a fifth transistor having a drain and a source connected to the gate of the third transistor, and a gate connected to the first control nodes, and
   each of the second capacitive elements includes
   a sixth transistor having a drain and a source connected to the gate of the fourth transistor, and a gate connected to the second control nodes.

10. The semiconductor integrated circuit according to claim 7, wherein
    the first time constant adjusting circuit further includes a first resistive element connected between the gate of the third transistor and the first node, and the second time constant adjusting circuit further includes
a second resistive element connected between the gate of the fourth transistor and the second node.

11. The semiconductor integrated circuit according to claim 7, wherein
the first time constant adjusting circuit further includes
a plurality of first inverters each electrically connected between the first capacitive element and the first control node, and
the second time constant adjusting circuit further includes
a plurality of second inverters each electrically connected between the second capacitive element and the second control node.

12. The semiconductor integrated circuit according to claim 1, wherein
the first time constant adjusting circuit includes
a plurality of first resistive elements connected parallelly between the gate of the third transistor and the first node, and
a plurality of first switches corresponding to the plurality of first resistive elements and connected in series to the corresponding first resistive elements between the gate of the third transistor and the first node, and
the second time constant adjusting circuit includes
a plurality of second resistive elements connected parallelly between the gate of the fourth transistor and the second node, and
a plurality of second switches corresponding to the plurality of second resistive elements and connected in series to the corresponding second resistive elements between the gate of the fourth transistor and the second node.

13. The semiconductor integrated circuit according to claim 12, wherein
the first time constant adjusting circuit includes
a plurality of first control nodes connected to control terminals of the plurality of first switches, and
the second time constant adjusting circuit includes
a plurality of second control nodes connected to control terminals of the plurality of second switches.

14. The semiconductor integrated circuit according to claim 13, wherein
the first time constant adjusting circuit further includes
a first capacitive element having a first end electrically connected to the gate of the third transistor, and a second end electrically connected to reference potential, and
the second time constant adjusting circuit further includes
a second capacitive element having a first end electrically connected to the gate of the fourth transistor, and a second end electrically connected to reference potential.

15. The semiconductor integrated circuit according to claim 12, wherein
the first time constant adjusting circuit further includes
a first capacitive element having a first end electrically connected to the gate of the third transistor, and
the second time constant adjusting circuit further includes
a second capacitive element having a first end electrically connected to the gate of the fourth transistor.

16. A semiconductor integrated circuit comprising:
an input circuit including an input stage, and an output stage electrically connected to the input stage via a first node and a second node, wherein
the input stage includes
a first transistor including a gate that receives an input signal,
a second transistor including agate that receives a reference signal,
a third transistor disposed adjacent to a drain of the first transistor,
a fourth transistor disposed adjacent to a drain of the second transistor,
a first time constant adjusting circuit electrically connected between a gate of the third transistor and the first node,
a second time constant adjusting circuit electrically connected between a gate of the fourth transistor and the second node, and
an offset suppression circuit electrically connected between the first and second time constant adjusting circuits and the first and second nodes.

17. A semiconductor integrated circuit comprising:
an input circuit including an input stage, and an output stage electrically connected to the input stage via a first node and a second node, wherein
the input stage includes
a first transistor including gate that receives an input signal,
a second transistor including a gate that receives a reference signal,
a third transistor disposed adjacent to a drain of the first transistor,
a fourth transistor disposed adjacent to a drain of the second transistor,
a first time constant adjusting circuit electrically connected between a gate of the third transistor and the first node,
a second time constant adjusting circuit electrically connected between a gate of the fourth transistor and the second node, and
an amplitude adjusting circuit electrically connected between the first and second time constant adjusting circuits and the first and second nodes.

18. The semiconductor integrated circuit according to claim 17, further comprising
a data latch connected to a plurality of input circuits.

19. A semiconductor storage device comprising:
a memory cell array; and
the semiconductor integrated circuit according to claim 17, disposed around the memory cell array.

* * * * *